(12) United States Patent
Kim et al.

(10) Patent No.: US 10,107,681 B2
(45) Date of Patent: Oct. 23, 2018

(54) TUBE-TYPE LENS, OPTICAL EMISSION SPECTROSCOPY (OES) APPARATUS INCLUDING THE TUBE-TYPE LENS, PLASMA MONITORING SYSTEM INCLUDING THE OES APPARATUS, AND METHOD OF MANUFACTURING SEMICONDUCTOR DEVICE BY USING THE PLASMA MONITORING SYSTEM

(71) Applicants: Samsung Electronics Co., Ltd., Suwon-si, Gyeonggi-do (KR); Industry-Academic Cooperation Foundation, Yonsei University, Seoul (KR)

(72) Inventors: In-joong Kim, Seoul (KR); Ilgu Yun, Seoul (KR)

(73) Assignees: Samsung Electronics Co., Ltd. (KR); Industry-Academic Cooperation Foundation, Yonsei University (KR)

(*) Notice: Subject to any disclaimer, the term of this patent is extended or adjusted under 35 U.S.C. 154(b) by 177 days.

(21) Appl. No.: 15/233,595

(22) Filed: Aug. 10, 2016

(65) Prior Publication Data

US 2017/0067779 A1 Mar. 9, 2017

(30) Foreign Application Priority Data

Sep. 8, 2015 (KR) .................. 10-2015-0127034

(51) Int. Cl.
*G01J 3/44* (2006.01)
*G01J 3/02* (2006.01)
*G02B 7/02* (2006.01)
*G02B 5/20* (2006.01)
*G01J 3/443* (2006.01)
*H01J 37/32* (2006.01)
*H01L 21/67* (2006.01)

(52) U.S. Cl.
CPC ............. *G01J 3/0208* (2013.01); *G01J 3/024* (2013.01); *G01J 3/0218* (2013.01);
(Continued)

(58) Field of Classification Search
CPC ...... G01J 3/0208; G01J 3/0218; G01J 3/0229; G01J 3/024; G01J 3/443; G02B 5/205; G02B 7/021
(Continued)

(56) References Cited

U.S. PATENT DOCUMENTS 4,798,948 A * 1/1989 Neumann ................ G02B 5/22
250/201.3
6,393,179 B1 * 5/2002 Cheng .................. G02B 6/2746
385/34

(Continued)

FOREIGN PATENT DOCUMENTS

JP 10-104073 4/1998
JP 2006-313847 11/2006
(Continued)

*Primary Examiner* — Sunghee Y Gray
(74) *Attorney, Agent, or Firm* — Myers Bigel, P.A.

(57) ABSTRACT

Provided are a tube-type lens usable for accurately detecting a plasma state in a plasma process, an optical emission spectroscopy (OES) apparatus including the tube-type lens, a plasma monitoring system including the OES apparatus, and a method of manufacturing a semiconductor device by using the plasma monitoring system. The tube-type lens includes: a cylindrical tube; a first lens disposed at an entrance of the cylindrical tube, on which light is incident, the first lens including a central portion which prevents transmission of the light and a second lens disposed at an exit of the cylindrical tube, from which the light exits.

19 Claims, 32 Drawing Sheets

(52) U.S. Cl.
CPC ............ *G01J 3/0229* (2013.01); *G01J 3/443*
(2013.01); *G02B 5/205* (2013.01); *G02B*
*7/021* (2013.01); *H01J 37/3299* (2013.01);
*H01J 37/32972* (2013.01); *H01L 21/67253*
(2013.01)

(58) Field of Classification Search
USPC ........................................................ 356/301
See application file for complete search history.

(56) References Cited

U.S. PATENT DOCUMENTS

| | | | |
|---|---|---|---|
| 8,197,634 B2 | 6/2012 | Yokogawa et al. | |
| 2005/0020073 A1 | 1/2005 | Perry | |
| 2009/0269009 A1* | 10/2009 | Tanaka | G02B 6/2937 |
| | | | 385/39 |
| 2014/0022540 A1 | 1/2014 | Asakura et al. | |
| 2015/0124250 A1 | 5/2015 | Bao et al. | |
| 2015/0377701 A1* | 12/2015 | Pawluczyk | G01J 3/0243 |
| | | | 356/301 |

FOREIGN PATENT DOCUMENTS

| | | |
|---|---|---|
| JP | 2007-192701 | 8/2007 |
| KR | 1020030050098 | 6/2003 |
| KR | 1020090063596 | 6/2009 |
| KR | 1020110020577 | 3/2011 |
| KR | 20120127350 | 11/2012 |
| KR | 101335011 | 12/2013 |
| KR | 20140011996 | 1/2014 |

\* cited by examiner

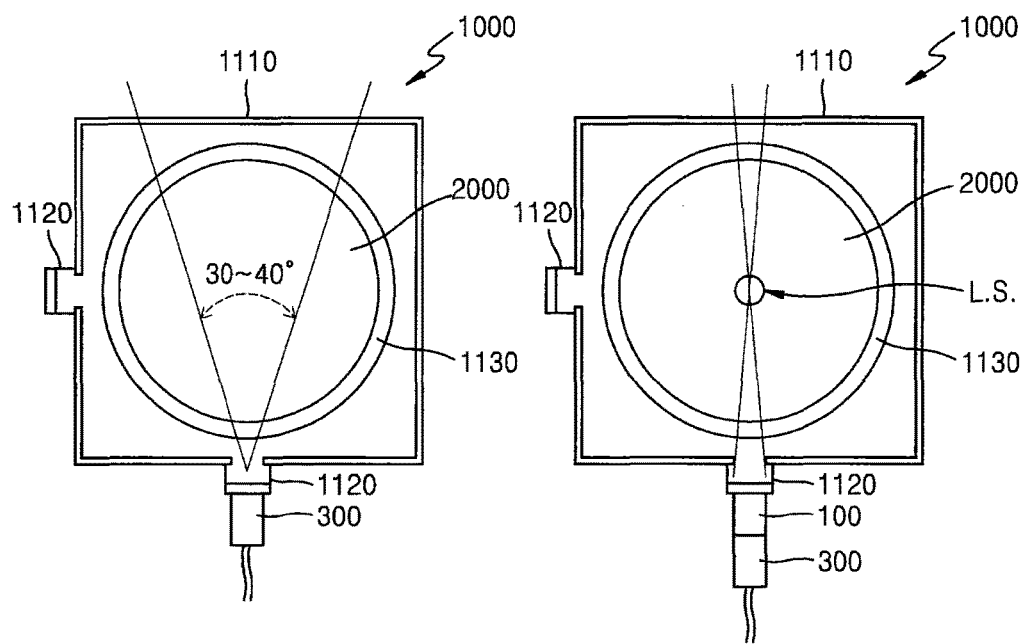

FIG. 7A    FIG. 7B    FIG. 7C
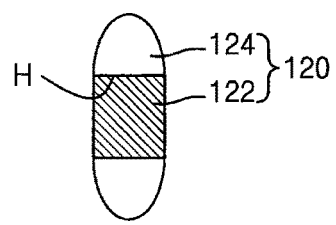 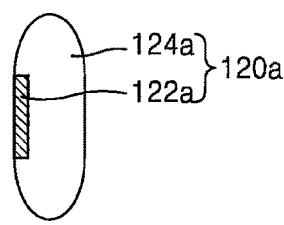 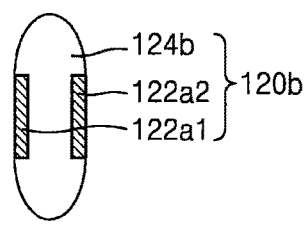
FIG. 7D    FIG. 7E
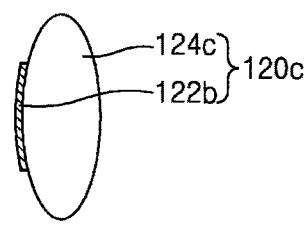 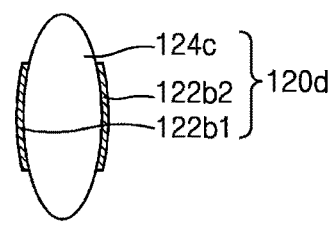
(d)    (e)

TUBE-TYPE LENS, OPTICAL EMISSION SPECTROSCOPY (OES) APPARATUS INCLUDING THE TUBE-TYPE LENS, PLASMA MONITORING SYSTEM INCLUDING THE OES APPARATUS, AND METHOD OF MANUFACTURING SEMICONDUCTOR DEVICE BY USING THE PLASMA MONITORING SYSTEM

CROSS-REFERENCE TO RELATED APPLICATION

This application claims the benefit of Korean Patent Application No. 10-2015-0127034, filed on Sep. 8, 2015, in the Korean Intellectual Property Office, the disclosure of which is incorporated herein in its entirety by reference.

BACKGROUND

The inventive concept relates to an apparatus for manufacturing a semiconductor device and a method of manufacturing a semiconductor device, and more particularly, to an apparatus for monitoring a plasma state in a plasma process and a method of manufacturing a semiconductor device by using the apparatus.

Plasma is widely used in a process of manufacturing a semiconductor, a plasma display panel (PDP), a liquid crystal display (LCD), a solar cell, or the like. Examples of the plasma process include a dry etching process, a plasma enhanced chemical vapor deposition (PECVD) process, a sputtering process, and an ashing process. Capacitively coupled plasma (CCP), inductively coupled plasma (ICP), helicon plasma, microwave plasma, or the like is commonly used. The plasma process is directly associated with plasma parameters (for example, electron density, electron temperature, ion beam, or ion energy). It is known that the plasma process is closely related to the electron density. Accordingly, the plasma sources having a high electron density are being developed.

SUMMARY

The inventive concept provides a tube-type lens usable for accurately detecting a plasma state in a plasma process, an optical emission spectroscopy (OES) apparatus including the tube-type lens, a plasma monitoring system including the OES apparatus, and a method of manufacturing a semiconductor device by using the plasma monitoring system.

According to an aspect of the inventive concept, there is provided a tube-type lens including: a cylindrical tube; a first lens configured to receive incident light into the cylindrical tube, the first lens being disposed at an entrance of the cylindrical tube, the first lens including a central portion configured to prevent transmission of light incident thereon; and a second lens configured to permit light to exit from the tube, the second lens being disposed at an exit of the cylindrical tube.

In some embodiments, the central portion of the first lens comprises a light blocking unit. The light blocking unit may include an opaque material layer filling a groove or a through-hole formed in the central portion of the first lens, or an opaque tape attached to a surface of a central portion of the first lens.

In some embodiments, the tube-type lens includes a light blocking structure disposed between the entrance of the cylindrical tube and the first lens and configured to prevent light entering the cylindrical tube from traveling toward a central portion of the first lens. The light blocking structure may include an optical filter, and a central portion of the optical filter corresponding to the central portion of the first lens may be configured to prevent transmission of light incident on the optical filter or has a low transmittance value.

In some embodiments, the first lens is configured to be replaced with another lens having a different focal point from the first lens, and a focal point of the second lens is fixed.

According to another aspect of the inventive concept, there is provided an optical emission spectroscopy (OES) apparatus including: a tube-type lens including a cylindrical tube; a first lens disposed at an entrance of the cylindrical tube, the first lens including a central portion that is configured to prevent transmission of light incident therethrough; and a second lens disposed at an exit of the cylindrical tube; and a spectroscope coupled to the tube-type lens at the entrance of the tube. In some embodiments, the central portion of the first lens comprises a light blocking unit, or the tube-type lens comprises a light blocking structure disposed between the entrance of the cylindrical tube and the first lens.

In some embodiments, the first lens comprises the light blocking unit, and the light blocking unit comprises: an opaque material layer filling the central portion of the first lens, or an opaque tape attached to a surface of the central portion of the first lens. The spectroscope may include an incidence aperture, on which light is incident, a diffraction grating configured to decompose the light according to wavelength, and an array detector configured to detect the decomposed light based on wavelength, and the tube-type lens is coupled to the spectroscope such that a focal point of the second lens is positioned in the incidence aperture.

In some embodiments, an optical fiber is between the tube-type lens and the spectroscope, wherein the tube-type lens is coupled to the optical fiber such that a focal point of the second lens is positioned on an incident surface of the optical fiber.

In some embodiments, a coupling guide is configured to couple the tube-type lens to the optical fiber.

In some embodiments, the first lens is configured to be replaced with another lens having a different focal point from the first lens, a focal point of the second lens is fixed, and the tube-type lens is coupled to a viewport of a chamber in a non-invasive manner. An entrance surface of the tube-type lens may be coupled to an outer surface of the viewport at an angle within a predetermined range.

According to another aspect of the inventive concept, there is provided a plasma monitoring system including: a chamber for a plasma process; a radio frequency (RF) power supply configured to generate plasma in the chamber; an OES apparatus including: a tube-type lens including a cylindrical tube, a first lens disposed at an entrance of the cylindrical tube, and a second lens disposed at an exit of the cylindrical tube, wherein a central portion of the first lens is configured to prevent transmission of light incident therethrough; and a spectroscope coupled to the tube-type lens at the exit of the cylindrical tube, wherein the OES apparatus is coupled to a viewport of the chamber in a non-invasive manner; and an analyzer electrically connected to the OES apparatus.

In some embodiments, the first lens comprises a light blocking unit, the light blocking unit including: an opaque material layer filling the central portion of the first lens, or an opaque tape attached to a surface of the central portion of the first lens.

In some embodiments, the tube-type lens comprises a light blocking structure disposed between the entrance of the cylindrical tube and the first lens and configured to prevent light entering the cylindrical tube from traveling toward the central portion of the first lens.

In some embodiments, the OES apparatus comprises an optical fiber between the tube-type lens and the spectroscope, the first lens is configured to be replaced with a with another lens having a different focal point from the first lens, and a focal point of the second lens is fixed and is positioned on an incident surface of the optical fiber.

In some embodiments, an entrance surface of the tube-type lens is coupled to an outer surface of the viewport at an angle within a predetermined range.

In some embodiments, the analyzer is configured to analyze a plasma state in the chamber based on light intensity of plasma light detected by the spectroscope.

According to another aspect of the inventive concept, there is provided a method of manufacturing a semiconductor device, the method including: coupling an OES apparatus to a viewport of a chamber for a plasma process in a non-invasive manner; placing a wafer in the chamber; generating plasma by injecting a process gas into the chamber and supplying RF power to the chamber; detecting, by the OES apparatus, plasma light generated in the chamber; and analyzing a plasma state in the chamber based on an intensity of the plasma light, wherein the OES apparatus includes: a tube-type lens including a cylindrical tube, a first lens disposed at an entrance of the cylindrical tube, and a second lens disposed at an exit of the cylindrical tube, wherein a central portion of the first lens is configured to prevent transmission of light incident therethrough; and a spectroscope coupled to the tube-type lens at the exit of the cylindrical tube.

In some embodiments, the central portion of the first lens comprises a light blocking unit, or the tube-type lens comprises a light blocking structure disposed between the entrance of the cylindrical tube and the first lens.

In some embodiments, the OES apparatus comprises an optical fiber between the tube-type lens and the spectroscope, and the coupling in the non-invasive manner comprises coupling the tube-type lens to the optical fiber via a coupling guide.

In some embodiments, changing a focal point of the first lens by replacing the first lens with a lens having a different focal point, a focal point of the second lens is fixed, and the coupling in the non-invasive manner comprises coupling the tube-type lens to the optical fiber such that the focal point of the second lens is positioned on an incident surface of the optical fiber.

In some embodiments, the coupling in the non-invasive manner comprises coupling an incident surface of the tube-type lens to an outer surface of the viewport at an angle within a predetermined range.

In some embodiments when the plasma state is outside of an allowable range, a process of measuring the wafer is performed, and when the plasma state is within the allowable range, the process of measuring the wafer is omitted.

In some embodiments, when the plasma state is outside of an allowable range, process parameters in the generating of the plasma are adjusted.

In some embodiments, the plasma process comprises one of an etching process, a deposition process, and a diffusion process with respect to the wafer, and the generating of the plasma comprises performing one of the etching process, deposition process, and the diffusion process with respect to the wafer.

In some embodiments, the analyzing of the plasma state comprises determining whether the plasma state is within an allowable range by comparing the intensity of the plasma light with intensity of light quantified with respect to a set reference plasma state.

In some embodiments, when the plasma state is within an allowable range, the analyzing of the plasma state comprises: performing a subsequent semiconductor process on the wafer; dividing the wafer into semiconductor chips; and packaging the semiconductor chips.

According to another aspect of the inventive concept, an optical emission spectroscopy (OES) apparatus is provided including a tube-type lens comprising: a cylindrical tube; a first lens configured to receive incident light into the cylindrical tube, the first lens being disposed at an entrance of the cylindrical tube; a second lens configured to permit light to exit from the tube, the second lens being disposed at an exit of the cylindrical tube; and a light blocking portion configured to prevent transmission through a portion of the tube-type lens; and a spectroscope coupled to the tube-type lens at the entrance of the cylindrical tube.

In some embodiments the light blocking portion comprises a light blocking unit, and the central portion of the first lens comprises a light blocking unit.

In some embodiments, the light blocking portion comprises a light blocking structure disposed between the entrance of the cylindrical tube and the first lens.

In some embodiments, the first lens comprises the light blocking unit, and the light blocking unit comprises: an opaque material layer filling the central portion of the first lens, or an opaque tape attached to a surface of the central portion of the first lens.

In some embodiments, the spectroscope comprises an incidence aperture, on which light is incident, a diffraction grating configured to decompose the light according to wavelength, and an array detector configured to detect the decomposed light based on wavelength, and the tube-type lens is coupled to the spectroscope such that a focal point of the second lens is positioned in the incidence aperture.

In some embodiments, an optical fiber between the tube-type lens and the spectroscope, and the tube-type lens is coupled to the optical fiber such that a focal point of the second lens is positioned on an incident surface of the optical fiber.

In some embodiments, a coupling guide configured to couple the tube-type lens to the optical fiber.

In some embodiments, the first lens is configured to be replaced with another lens having a different focal point from the first lens, a focal point of the second lens is fixed, and the tube-type lens is coupled to a viewport of a chamber in a non-invasive manner, and an entrance surface of the tube-type lens is coupled to an outer surface of the viewport at an angle within a predetermined range.

BRIEF DESCRIPTION OF THE DRAWINGS

Example embodiments of the inventive concept will be more clearly understood from the following detailed description taken in conjunction with the accompanying drawings in which:

FIG. 4A is a conceptual diagram illustrating a measurement region of a chamber in a case where an OES apparatus does not include a tube-type lens, and FIG. 4B is a conceptual diagram illustrating a measurement region of a chamber in a case where an OES apparatus includes a tube-type lens;

FIGS. 7A-7E are cross-sectional views illustrating various shapes of a first lens of the tube-type lens of FIG. 1A, in which a light blocking unit is formed in a central portion;

DETAILED DESCRIPTION OF THE EMBODIMENTS

Figure 1A:
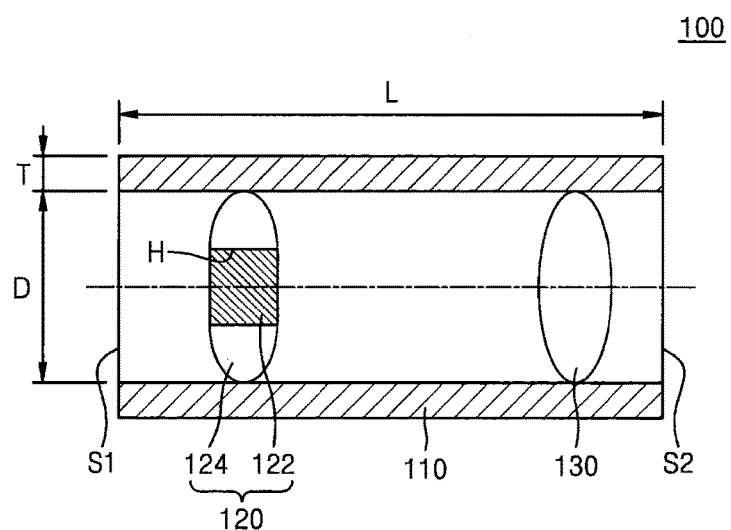
FIGS. 1A to 1C are respectively a cross-sectional view and plan views of a tube-type lens according to an example embodiment of the inventive concept.

The inventive concept will now be described more fully with reference to the accompanying drawings, in which example embodiments of the inventive concept are shown. The inventive concept may, however, be embodied in many different forms and should not be construed as being limited to the example embodiments set forth herein; rather, these example embodiments are provided so that this disclosure will be thorough and complete, and will fully convey the concept of the inventive concept to those skilled in the art. As used herein, the term "and/or" includes any and all combinations of one or more of the associated listed.

It will be understood that when an element is referred to as being "on," "connected to" or "coupled to" another element, it may be directly on, connected or coupled to the other element or intervening elements may be present. In the drawings, the dimensions of structures are exaggerated for clarity of the inventive concept. Parts having no relation to descriptions are omitted. Like reference numerals denote like elements throughout the specification and drawings. In the drawings. The terms used in the present specification are merely used to describe particular embodiments, and are not intended to limit the inventive concept.

Figure 1B:
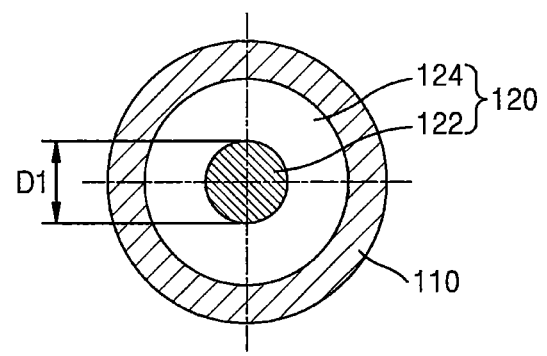
Figure 1C:
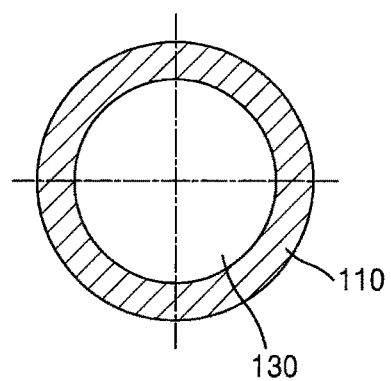

FIGS. 1A to 1C are respectively a cross-sectional view and plan views of a tube-type lens 100 according to an example embodiment of the inventive concept. Specifically, FIG. 1B is a plan view when viewed from an entrance S1 on which light is incident, and FIG. 1C is a plan view when viewed from an exit S2 from which light exits.

Referring to FIGS. 1A to 1C, the tube-type lens 100 according to the present example embodiment may include a tube 110, a first lens 120, and a second lens 130.

The tube 110 may be formed to have a hollow cylindrical tube structure. However, the shape of the tube 110 is not limited to the cylindrical tube structure, and any suitable structure or shape may be used. For example, the tube 110 may have a hollow oval cylindrical tube structure or a hollow polygonal cylindrical tube structure. An empty-space structure of the center of the tube 110 may have a cylindrical shape, but is not limited thereto, and any suitable shape may be used. The tube-type lens 100 may be constituted by arranging the first lens 120 and the second lens 130 side by side in the empty space of the tube 110.

The tube 110 may be made of plastic or a metal. In a case where the tube 110 is made of plastic, a material having high durability and high hardness may be used. Examples of the material having high durability and high hardness may include poly-methylmethacrylate (PMMA), poly-carbonate (PC), teflon (poly-tetrafluoroethylene (PTEE)), poly-ethylene (PE), and fiber reinforced plastics (FRP). In a case where the tube 110 is made of a metal, a relatively light metal may be used. Examples of the relatively light metal may include duralumin, aluminum, and titanium.

The tube 110 may have an inner diameter D1 of several centimeters (cm) and a thickness T of about 1 cm or less. An internal area of the tube 110 may be changed according to an area of a viewport (see 1120 of FIG. 4) of a chamber (see 1110 of FIG. 4) to which the tube-type lens 100 is coupled. For example, when the viewport has a diameter of about 4 cm to about 5 cm, the tube 110 may have an inner diameter D of about 4 cm to about 5 cm. The tube 110 may have a length L of about 6 cm to about 7 cm. However, the length L of the tube may be less than 6 cm or greater than 7 cm. For example, the length L of the tube 110 may be about 10 cm. However, the inner diameter D, the thickness T, and the length L of the tube 110 are not limited thereto, and any suitably dimensioned tube may be used.

The first lens 120 may be disposed adjacent to the entrance S1 of the tube-type lens 100. The first lens 120 may include a light blocking unit 122 in a central portion thereof and a lens unit 124 in a peripheral portion.

The light blocking unit 122 may be made of an opaque material that does not transmit light. The opaque material may have an absorptive characteristic or a reflective characteristic depending on the method used to prepare the opaque material. The light blocking unit 122 of the first lens 120 may be formed to have an absorptive characteristic. However, the light blocking unit 122 may also be formed to have a reflective characteristic. The light blocking unit 122 may be made of a glass, a rubber, or a synthetic resin (or plastic) including a black pigment or other opaque color pigments. For example, as the opaque pigment, oxides such as $Fe_2O_3$, MnO, $MnO_2$, $Cr_2O_3$, or CoO may be used for obtaining a black color, and oxides such as $TiO_2$, $CeO_2$, or $ZrO_2$ may be used for obtaining a white color.

The light blocking unit 122 may be formed in the central portion of the first lens 120 to fill a through-hole H of the lens unit 124. For example, the light blocking unit 122 may have a cylindrical shape to fill the through-hole H. The diameter D1 of the light blocking unit 122 may be changed according to a diameter of the lens unit 124, i.e., the inner diameter D of the tube 110, and a light blocking degree of the central portion. For example, when the inner diameter D of the tube 110 is formed in the range of about 4 cm to about 5 cm, the diameter D1 of the light blocking unit 122 may be formed in the range of about 1 cm to about 3 cm. However, the diameter D1 of the light blocking unit 122 is not limited to the above value, and any suitably sized diameter may be used.

The lens unit 124 has a circular ring shape with the through-hole H in the central portion thereof and the light blocking unit 122 is formed in the through-hole H. Thus, the light blocking unit 122 may be surrounded by the lens unit 124. The lens unit 124 may be made of an optical glass or an optical plastic. The optical glass may be classified into a crown glass and a flint glass. A lens having a small aberration may be manufactured using a glass (having a high refractive index and a low dispersive power) including barium, a phosphoric acid, or fluorine. A general lens manufacturing process may include designing, minor cutting, cylinder shaping, cutting, rough grinding, polishing, center correction, bonding, and thin film deposition. In addition, the first lens 120 may be manufactured by forming the through-hole H in the central portion by using cutting through a laser or a blade, etching, polishing, or other appropriate technologies.

The second lens 130 may be disposed adjacent to the exit S2 of the tube-type lens 100. The second lens 130 may be made of an optical glass or an optical plastic and may have a general lens structure. A focal point of the second lens 130 may be fixed. The focal point of the second lens 130 may be positioned on an incident surface of an optical element that is connected to the exit S2 of the tube-type lens 100. Since the focal point of the second lens 130 is positioned on the incident surface of the optical element, incidence efficiency of light incident on the optical element may be maximized.

On the other hand, a plurality of first lenses 120 having different focal points may be prepared. When plasma light in the chamber (see 1110 of FIG. 4) is measured by using the tube-type lens 100, the first lenses 120 having different focal points may be used to measure the plasma light while being replaced. The terms "respective focal points of the first lenses 120" does not mean the presence of a plurality of focal points in a single first lens 120, but may mean the respective focal points of the plurality of first lenses having different focal points.

On the other hand, when the plasma light is measured, only one second lens 130 may be used. Thus, the focal point of the second lens 130 may be fixed. The second lens 130 may be replaced with second lenses that have different focal points according to the position of the incident surface of the optical element connected to the exit S2 of the tube-type lens 100. The plasma light is measured while replacing the first lenses 120 having different focal points, so as to detect plasma light of a specific region in the chamber. Details will be described with reference to FIGS. 12A to 15.

The tube-type lens 100 according to the present example embodiment may include the first lens 120 and the second lens 130, and the first lens 120 may be configured to block light transmission through the central portion thereto. When the plasma light in the chamber is measured by using an optical emission spectroscopy (OES) apparatus that is an optical diagnosis apparatus of a plasma process, the tube-type lens 100 may be included in the OES apparatus and be used to accurately detect plasma light of a local region in the chamber. A principle of accurately detecting the plasma light of the local region in the chamber will be described below with reference to FIGS. 12A to 15.

In the case of an existing OES apparatus, an optical fiber is directed toward the center of a chamber through a viewport. Only plasma light ranging between about 30° to about 40° is measured according to characteristics of the optical fiber, and the entire plasma light ranging therebetween is measured. Thus, it is difficult to detect a plasma state and a fine change in plasma according to a specific position in the chamber or a specific position on a wafer. However, the tube-type lens 100 according to the present example embodiment is inserted between the optical fiber of the OES apparatus and the viewport of the chamber, and the plasma light of the local region in the chamber is received by using the lens unit 124 of the first lens 120. Therefore, it is possible to detect an abnormal state of plasma with respect to each position in the chamber and perform spatial analysis of the plasma state.

Figure 2:
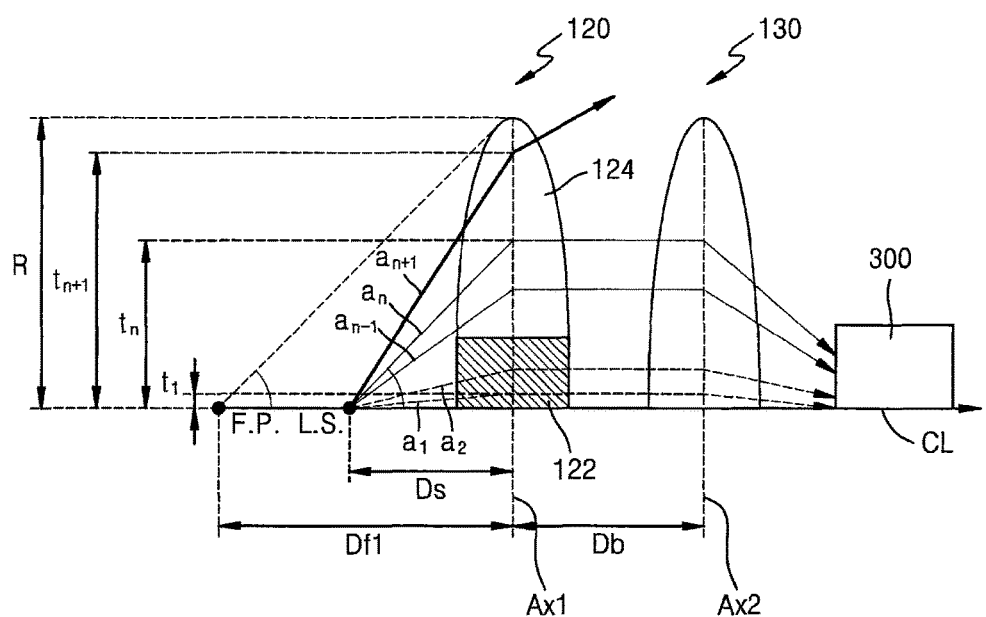
FIG. 2 is a conceptual diagram of a path along which light travels and is incident on an optical fiber, in a case where two lenses are arranged side by side and a light blocking unit is formed in a central portion of a first lens on which the light is incident.

FIG. 2 is a conceptual diagram of a path along which light travels and is incident on an optical fiber, in a case where a first lens 120 and a second lens 130 are arranged side by side and a light blocking unit is formed in a central portion of the first lens on which the light beam is incident.

Referring to FIG. 2, the first lens 120 and the second lens 130 may be arranged side by side and spaced apart from each other by a distance Db, and light from a light source L.S. may be incident on an optical fiber 300 through the first lens 120 and the second lens 130. The light from the light source L.S. may be incident on the first lens 120 through various paths. A traveling path of the light from the light source L.S. may be divided into $a_1, a_2, \ldots, a_{n-1}, a_n, a_{n+1}$ at predetermined angles subdivided with respect to a line CL passing through the centers of the first lens 120 and the second lens 130.

Assuming that there is no light blocking unit 122 in the central portion of the first lens 120 and there is no optical loss from a central axis Ax1 of the first lens 120 to the optical fiber, intensity (OFin) of light on the incident surface of the optical fiber may be calculated using Equation (1) below.

$$\text{OFin} = \text{LSin} \times (1/a_1^2 + 1/a_2^2 + 1/a_3^2 + , \ldots , +1/a_{n-1}^2 + 1/a_n^2) \quad \text{Equation (1)}$$

In Equation 1, LSin may represent intensity of light at a position of the light source L.S. Light traveling along the path $a_{n+1}$ may be excluded from the intensity calculation because it is not incident on the second lens 130. For reference, since refraction of light occurs on the surface of the lens, refraction occurs on both surfaces of each of the first lens 120 and the second lens 130. However, for convenience of calculation, it is assumed that refraction occurs in central axes Ax1 and Ax1 of the first lens 120 and the second lens 130. Under this assumption, the path $a_n$ of the light may be expressed as Equation (2) below.

$$a_n^2 = Ds^2 + t_n^2 \quad \text{Equation (2)}$$

In Equation (2), Ds may represent a distance between the central axis Ax1 of the first lens 120 and the light source L.S., and $t_n$ may represent a height at which the light traveling along the path $a_n$ meets the central axis Ax1 of the first lens 120. R may represent a radius of the first lens 120 and the second lens 130, and Df1 may represent a distance between the central axis Ax1 of the first lens 120 and the focal point F.P., i.e., a focal length of the first lens 120.

As in the tube-type lens 100 according to the present example embodiment, when the light blocking unit 122 is present in the central portion of the first lens 120, the paths of the light directed toward the light blocking unit 122 may be excluded from the intensity calculation in Equation (1). In this manner, the intensity calculation may be changed according to the presence or absence of the light blocking unit 122. The change in the intensity calculation may make it possible to detect an abnormal state of light from light sources disposed at different positions.

In other words, assuming that a plurality of light sources are present at different distances and respectively emit light, when a lens having a general structure is used it may be impossible to detect abnormality occurring in any one of the light sources. However, when the tube-type lens 100 according to the present example embodiment is used, it is possible to detect abnormality occurring in any one of the light sources. A principle of detecting the occurrence of the abnormality in the light sources at each position will be described below in more detail with reference to FIGS. 12A to 15.

Figure 3:
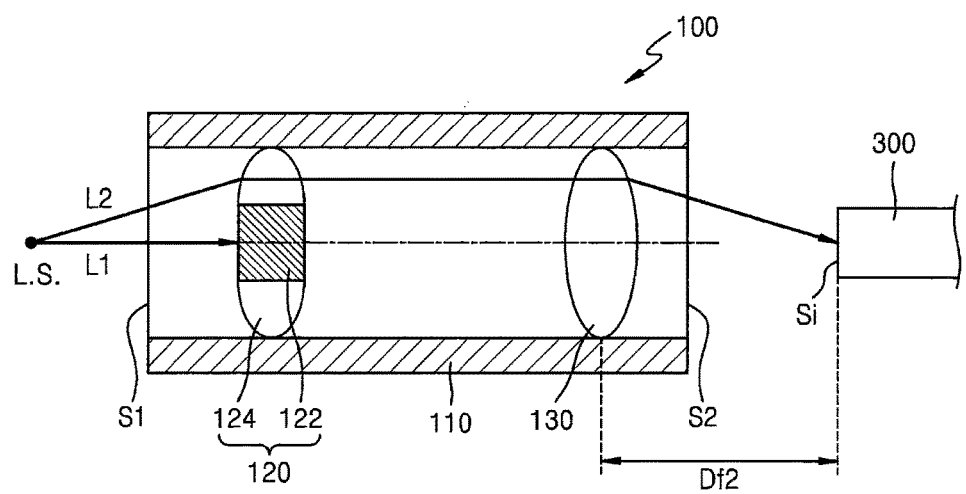
FIG. 3 is a conceptual diagram of a path along which light travels and is incident on an optical fiber in the tube-type lens of FIG. 1A.

FIG. 3 is a conceptual diagram of a path along which light travels and is incident on an optical fiber in the tube-type lens 100 of FIG. 1A. Herein, the descriptions provided with reference to FIGS. 1A to 2 will be provided briefly or will be omitted.

Referring to FIG. 3, light from the light source L.S. may be incident toward the entrance S1 of the tube-type lens 100 of the present example embodiment, be emitted toward the exit S2 through the first lens 120 and the second lens 130, and be incident on the optical fiber 300. The light from the light source L.S. may be classified into two types. For example, the light from the light source L.S. may be classified into first light L1, which is blocked by the light blocking unit 122 of the first lens 120, and second light L2, which passes through the lens unit 124 of the first lens 120 and travels toward the second lens 130. As described above, since the first light L1 is blocked by the light blocking unit 122, the first light L1 may be excluded from the intensity calculation and only the second light L2 may be included in the intensity calculation.

The tube-type lens 100 according to the present example embodiment may be coupled to an optical fiber 300 of an OES apparatus (500 of FIG. 16) or may be directly coupled to a spectroscope 400 thereof, so as to detect plasma light in a chamber (see 1110 of FIG. 4). When the plasma light is detected, the first lens 120 may be replaced with the first lenses 120 having different focal points in the tube-type lens 100, and the second lens 130 may be used without replacement. Accordingly, the first lens 120 may be coupled to the tube 110 in such a manner that the first lens 120 is easily detachable from the tube 110. Since the second lens 130 is used without replacement, the second lens 130 may be fixed to the tube 110. Thus, a focal point Df2 of the second lens 130 may also be fixed. For example, the focal point Df2 of the second lens 130 may be positioned on an incident surface S1 of an optical element, e.g., the optical fiber 300. When the position of the incident surface of the optical element (e.g., the optical fiber 300) coupled to the exit S2 of the tube-type lens 100 is changed, the focal point may be positioned on the corresponding incident surface by replacing the second lens 130.

FIG. 4A is a conceptual diagram illustrating a measurement region of a chamber 1110 when an OES apparatus does not include a tube-type lens, and FIG. 4B is a conceptual diagram illustrating a measurement region of a chamber 1110 when an OES apparatus includes a tube-type lens 100. For convenience, in the OES apparatus, FIG. 4A illustrates only an optical fiber part and FIG. 4B illustrates only an optical fiber part and a tube-type lens part. Herein, the descriptions provided with reference to FIGS. 1A to 3 will be provided briefly or will be omitted.

Referring to FIG. 4A, in an existing OES apparatus, the optical fiber 300 may be directly mounted on a viewport 1120 installed in the chamber 1110 of a chamber system 1000, and the optical fiber 300 may receive plasma light generated in the chamber 1110 and measure a plasma state. As illustrated, the optical fiber 300 of the existing OES apparatus may receive the plasma light ranging between about 30° and about 40°. Thus, only the plasma light corresponding about 40% of an area of a 12-inch wafer 2000 may be measured. In addition, since the optical fiber 300 detects the entire plasma light ranging between about 30° and about 40°, it may be difficult to know an abnormal portion of the plasma light even though abnormality of the plasma light is detected.

Referring to FIG. 4B, in an OES apparatus (see 500 of FIG. 16) according to the present example embodiment, a tube-type lens 100 may be coupled to a front end of the optical fiber 300, and the tube-type lens 100 may be mounted on a viewport 1120 of the chamber 1110. Thus, plasma light of a very narrow region may be received and measured. In addition, as will be described below, it is possible to detect abnormality of plasma light from a plasma light source L.S. of a local region by measuring plasma light while replacing first lenses 120 having different focal points. Therefore, the OES apparatus including the tube-type lens 100, according to the present example embodiment, may analyze a plasma state by measuring only the plasma light from the plasma light source L.S. that directly affects the wafer 2000 in the plasma process. An electrostatic chuck 1130 may hold the wafer 2000 placed thereon.

On the other hand, the plasma light source L.S. is illustrated as being disposed in the central portion of the wafer 2000, so as to describe that it is possible to measure plasma light from a plasma light source L.S. disposed at a specific position by using the OES apparatus including the tube-type lens 100. In practice, the plasma light is generated in most of the chamber 1110 in the plasma process. Therefore, numerous positions of the entire chamber 1110 may correspond to plasma light sources, and the illustrated plasma light source L.S. may be one of the plasma light sources.

Figure 5A:
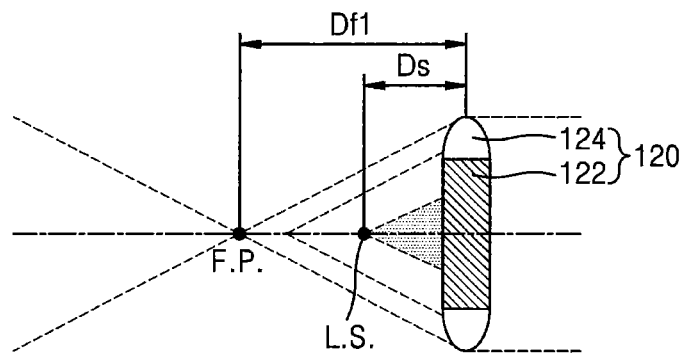
FIGS. 5A-C are conceptual diagrams illustrating light intensity in a case where a focal point is fixed with respect to a first lens of the tube-type lens of FIG. 1A, in which a light blocking unit is formed in a central portion, and a position of a light source is changed, respectively.
Figure 5B:
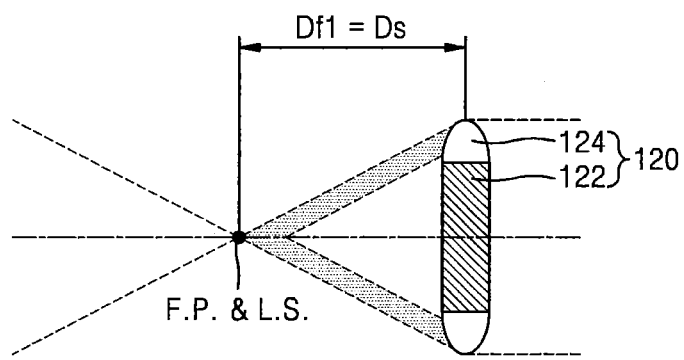
Figure 5C:
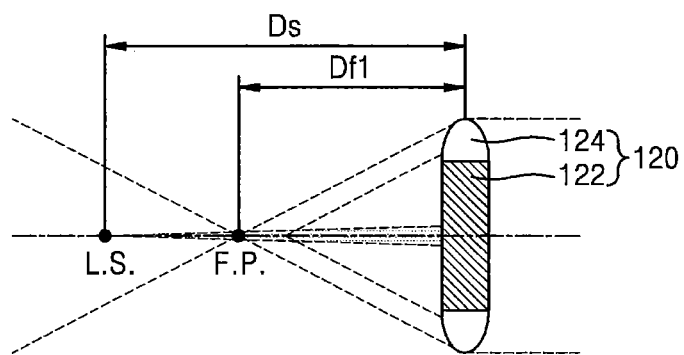

FIGS. 5A-5C are a conceptual diagram illustrating light intensity in a case where the focal point is fixed with respect to the first lens 120 of the tube-type lens 100 of FIG. 1A, in which the light blocking unit 122 is formed in the central portion thereof, and the position of the light source L.S. is changed. The light intensity may correspond to light intensity on a rear surface of the first lens 120, a front surface of the second lens 130, or an incident surface of the optical fiber.

Referring to FIG. 5A, when the light source L.S. is disposed between the first lens 120 and the focal point F.P. of the first lens 120, most of light from the light source L.S. may be blocked by the light blocking unit 122. Light of a peripheral portion, which travels at a large incident angle, may not travel toward the second lens 130 through the lens unit 124. Thus, the light intensity may be substantially zero.

Referring to FIG. 5B, when the light source L.S. is disposed at the same position as the focal point F.P. of the first lens 120, a relatively large amount of light from the light source L.S. may travel toward the second lens 130 through the lens unit 124. Thus, the light intensity may be greater than zero. Even when the light source L.S. is disposed at the same position as the focal point F.P. of the first lens 120, most of light may be blocked by the light blocking unit 122. In addition, in the structure of the first lens 120 including the light blocking unit 122 in the central portion, the light intensity may not be maximum when the light source L.S. is disposed at the same position as the focal point F.P. of the first lens 120. In other words, although the maximum light intensity is slightly associated with the focal length, it is mainly associated with a size of the light blocking unit 122 and a distance between the first lens 120 and the light source L.S. For example, when the size of the light blocking unit 122 is very small, the light intensity may be maximum when the light source L.S. approaches the first lens 120 to be closer than the focal point F.P. of the first lens 120. In addition, when the light blocking unit 122 is sufficiently large to occupy most of the first lens 120, the light intensity may be maximum when the light source L.S. is farther away from the focal point F.P. of the first lens 120.

Referring to FIG. 5C, when the light source L.S. is disposed outside the focal point F.P. of the first lens 120, the light intensity may be relatively low. In addition, when the light source L.S. is very far away from the focal point F.P. of the first lens 120 in a direction away from the first lens 120, the light intensity may be substantially zero.

Figure 6A:
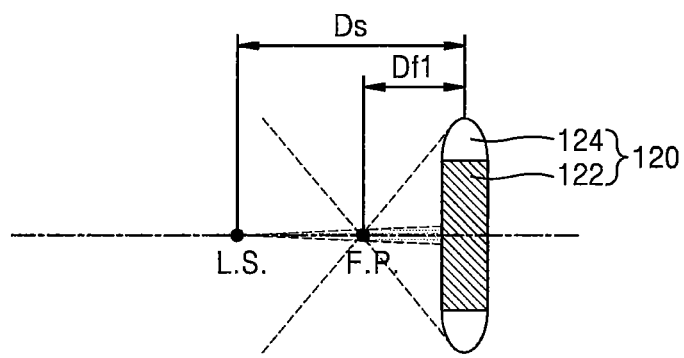
FIGS. 6A-6C are conceptual diagrams illustrating light intensity in a case where a light source is fixed with respect to a first lens of the tube-type lens of FIG. 1A, in which a light blocking unit is formed in a central portion, and a focal position is changed, respectively.
Figure 6B:
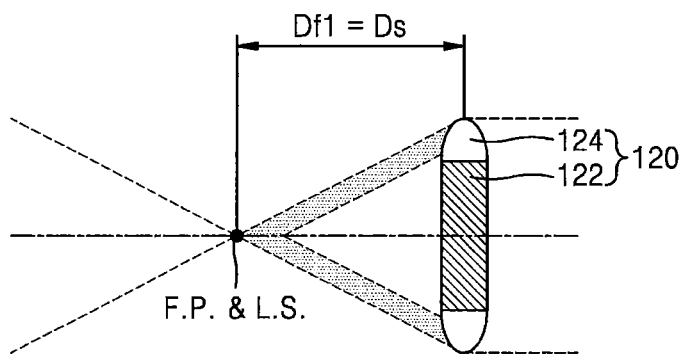
Figure 6C:
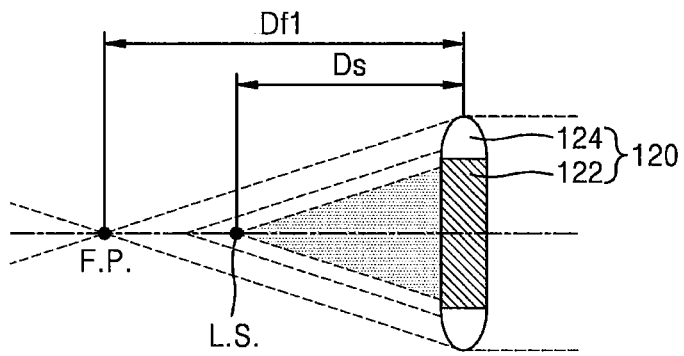

FIGS. 6A-6C are a conceptual diagram illustrating light intensity in a case where the light source L.S. is fixed with respect to the first lens 120 of the tube-type lens 100 of FIG. 1A, in which the light blocking unit is formed in the central portion, and a focal position is changed. The light intensity may correspond to light intensity on the rear surface of the first lens 120 the front surface of the second lens 130, or the incident surface of the optical fiber.

Referring to FIG. 6A, when the focal point F.P. of the first lens 120 is between the light source L.S. and the first lens 120, the light intensity may be relatively low. In particular, when the light source L.S. is very far away from the first lens 120 as compared with the focal point F.P. of the first lens 120, the light intensity may be substantially zero. A positional relationship between the focal point F.P. and the light source L.S. and the light intensity in FIG. 6A may correspond to FIG. 5C.

Referring to FIG. 6B, when the focal point F.P. of the first lens 120 is the same as the position of the light source L.S., a relatively large amount of light from the light source L.S. may travel toward the second lens 130 through the lens unit 124. Thus, the light intensity may be greater than zero. A positional relationship between the focal point F.P. and the light source L.S. and the light intensity in FIG. 6B may correspond to FIG. 5B.

Referring to FIG. 6C, when the focal point F.P. of the first lens 120 is located outside the position of the light source L.S., most of light from the light source L.S. may be blocked by the light blocking unit 122. Light of a peripheral portion, which travels at a large incident angle, may not travel toward the second lens 130 through the lens unit 124. Thus, the light intensity may be substantially zero. A positional relationship between the focal point F.P. and the light source L.S. in FIG. 6C and the light intensity may correspond to FIG. 5A.

FIGS. 7A-7E is cross-sectional views illustrating various shapes of the first lens 120 of the tube-type lens 100 of FIG. 1A, in which the light blocking unit 122 is formed in a central portion. Herein, the descriptions provided with reference to FIGS. 1A to 6 will be provided briefly or will be omitted.

A first lens 120 of FIG. 7A may correspond to the first lens 120 included in the tube-type lens 100 of FIG. 1A. Accordingly, the first lens 120 may include a light blocking unit 122 and a lens unit 124, and the light blocking unit 122 may be formed to fill a through-hole H of the lens unit 124.

A first lens 120a of FIG. 7B may have a different structure from the first lens 120 of FIG. 7A. That is, in the first lens 120a, a light blocking unit 122a may fill a shallow groove formed on a surface of a lens unit 124a, instead of passing through the lens unit 124a. When viewed from the entrance S1 of the tube 110, the light blocking unit 122a may have a circular structure as in the light blocking unit 122 of FIG. 1B. Therefore, the function of the light blocking unit 122a of the first lens 120a illustrated in FIG. 7B may be substantially the same as the function of the light blocking unit 122 of the first lens 120 illustrated in FIG. 7A. A material of the light blocking unit 122a may be substantially the same as that described with reference to FIGS. 1A to 1C.

As in the first lens 120a of FIG. 7B, a first lens 120b of FIG. 7C may be formed such that light blocking units 122a1 and 122a2 fill shallow grooves of a lens unit 124b. However, as illustrated, the first lens 120b may differ from the first lens 120a of FIG. 7B in that the light blocking units 122a1 and 122a2 are respectively formed on both surfaces of the lens unit 124b. When viewed from the entrance S1 of the tube 110, the light blocking units 122a1 and 122a2 of the first lens 120b may have a circular structure, and the function thereof may be substantially the same as the function of the light blocking unit 122 of the first lens 120 illustrated in FIG. 7A. In addition, a material of the light blocking units 122a1 and 122a2 may be substantially the same as that described with reference to FIGS. 1A to 1C.

A first lens 120c of FIG. 7D may differ from the first lenses 120,120a, and 120b in that a light blocking unit 122b is additionally formed on a surface of a lens unit 124c, instead of filling a through-hole or a groove of the lens unit 124c. The light blocking unit 122b according to the present example embodiment may be formed by attaching an opaque adhesive to the surface of the lens unit 124c. In addition, the light blocking unit 122b may be formed by preparing a pigment, a painting ink, or a paint and coloring the surface of the lens unit 124c. When viewed from the entrance S1 of the tube 110, the light blocking unit 122b of the first lens 120c may have a circular structure, and the function thereof may be substantially the same as the function of the light blocking unit 122 of the first lens 120 illustrated in FIG. 7A.

As in the first lens 120c of FIG. 7D, a first lens 120d of FIG. 7E may be configured such that light blocking units 122b1 and 122b2 are additionally formed on a surface of the lens unit 124c. However, as illustrated, the first lens 120d may differ from the first lens 120c of FIG. 7D in that the light blocking units 122b1 and 122b2 are respectively formed on both surfaces of the lens unit 124c. When viewed from the entrance S1 of the tube 110, the light blocking units 122b1 and 122b2 of the first lens 120d may have a circular structure, and the function thereof may be substantially the same as the function of the light blocking unit 122 of the first lens 120 illustrated in FIG. 7A.

Besides the above-described structures or forming methods, the light blocking unit of the first lens may be formed to have various structures by using various methods. For example, as a material similar to the pigment, there is a dye that is a colored powder soluble in water or an organic solvent. The dye may be used to color a fiber or plastic. Therefore, the light blocking unit of the first lens may be formed by using the dye. In addition, the light blocking unit of the first lens may be formed by removing a gloss of a partial surface of the lens unit or coating a partial surface of the lens unit with an opaque material. Furthermore, the light blocking unit of the first lens may be formed by making a portion of the lens unit be opaque or less transparent by using laser etching, polishing, or other appropriate technologies.

Figure 8A:
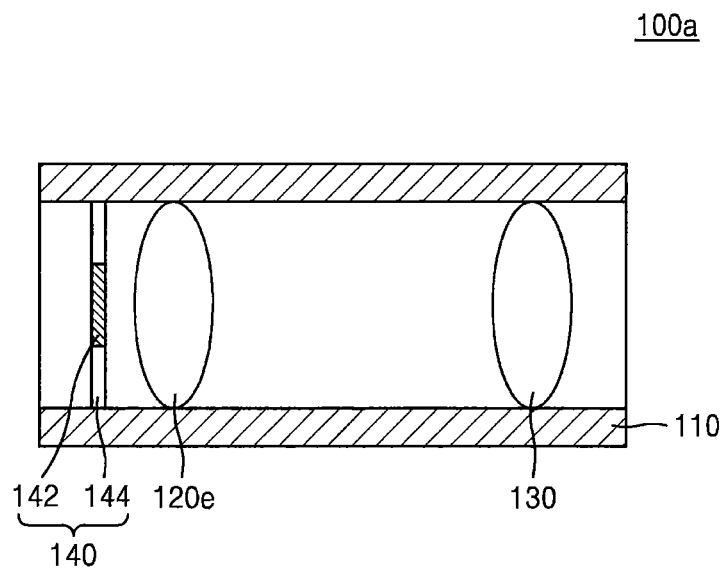
FIG. 8A is a cross-sectional view of a tube-type lens according to an example embodiment of the inventive concept.
Figure 8B:
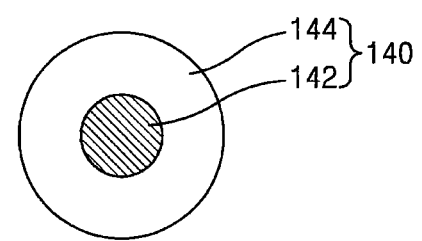
FIG. 8B is a plan view of a light blocking structure included in the tube-type lens of FIG. 8A.

FIG. 8A is a cross-sectional view of a tube-type lens 100a according to another example embodiment of the inventive concept, and FIG. 8B is a plan view of a light blocking structure 140 included in the tube-type lens 100a of FIG. 8A. Herein, the descriptions provided with reference to FIGS. 1A to 7 will be provided briefly or will be omitted.

The tube-type lens 100a of FIGS. 8A and 8B may differ from the tube-type lens 100 of FIG. 1A in that the light blocking structure 140 is further included so that light does not pass through a central portion of a first lens 120e. Specifically, the tube-type lens 100a according to the present example embodiment may include a tube 110, the first lens 120e, a second lens 130, and the light blocking structure 140. The tube 110 and the second lens 130 are substantially the same as those of the tube-type lens 100 of FIG. 1A. As in the second lens 130, the first lens 120e may have a general lens structure. That is, a light blocking unit may not be formed in the central portion of the first lens 120e.

As in the first lens 120 of the tube-type lens 100 of FIG. 1A, the first lens 120e may be coupled to the tube 110 in such a manner that the first lens 120e is easily detachable from the tube 110. In addition, a plurality of first lenses 120e having different focal points may be prepared. The first lenses 120e having different focal points may be used to measure plasma light while being replaced As illustrated in FIG. 8B, the light blocking structure 140 may have a circular plate structure and may include a light blocking part 142 in a central portion and a light transmission part 144 in a peripheral portion. A structure and material of the light blocking part 142 may be substantially the same as those of the light blocking unit 122 of the first lens 120 of the tube-type lens 100 illustrated in FIG. 1A. For example, the light blocking part 142 may be formed by filling a through-hole with an opaque material, the through-hole being formed in a central portion of the light transmission part 144. Besides, the light blocking part 142 may be formed to have various structures as in the light blocking units of the first lenses illustrated in FIG. 7.

Unlike the structures of the first lens 120e and the second lens 130, the light transmission part 144 may have a flat glass structure with a uniform thickness. As described above, a through-hole for the light blocking part 142 may be formed in a central portion of the light transmission part 144. However, when the light blocking part 142 is formed to have a structure similar to the first lenses 120a and 120b illustrated in FIGS. 7B and 7C, a shallow groove instead of the through-hole may be formed in the light transmission part 144. In addition, when the light blocking part 142 is formed to have a structure similar to the first lenses 120c and 120d illustrated in FIGS. 7D and 7E, neither the through-hole nor the groove may be formed in the light transmission part 144.

In the tube-type lens 100a according to the present example embodiment, the light blocking structure 140 is disposed in front of the first lens 120e, so that the light blocking structure 140 and the first lens 120e perform the function of the first lens 120 of the tube-type lens 100 of FIG. 1A. In other words, since the light blocking structure 140 blocks the light traveling toward the central portion through the light blocking part 142, the light traveling toward the central portion of the first lens 120e may be blocked, thus preventing the light from passing through the central portion of the first lens 120e. On the other hand, since the tube-type lens 100a according to the present example embodiment blocks the light traveling toward the central portion and transmits the light traveling toward the peripheral portion, the light blocking structure 140 may correspond to a type of an optical filter.

Figure 9A:
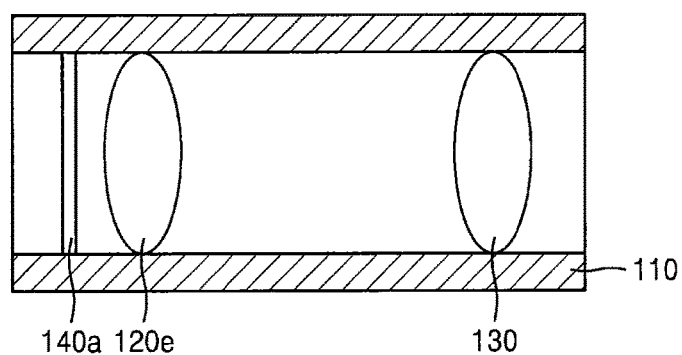
FIG. 9A is a cross-sectional view of a tube-type lens according to another example embodiment of the inventive concept.
Figure 9B:
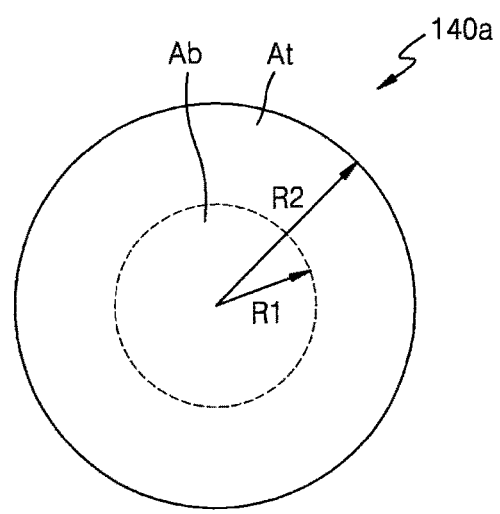
FIG. 9B is a plan view of a light blocking structure included in the tube-type lens of FIG. 9A.

FIG. 9A is a cross-sectional view of a tube-type lens 100b according to another example embodiment of the inventive concept, and FIG. 9B is a plan view of a light blocking structure 140a included in the tube-type lens 100b of FIG. 9A. Herein, the descriptions provided with reference to FIGS. 1A to 8 will be provided briefly or will be omitted.

The tube-type lens 100b of FIGS. 9A and 9B may be similar to the tube-type lens 100a of FIG. 8A in that the light blocking structure 140a is further included in front of the first lens 120e. However, the function and structure of the light blocking structure 140a may be different from those of the light blocking structure 140 of the tube-type lens 100a of FIG. 8A.

For example, in the tube-type lens 100b according to the present example embodiment, the light blocking structure 140a may be a type of an optical filter and transmittance of light may be reduced as a distance to the center thereof is shorter. The light blocking structure 140a may have a circular plate structure. However, unlike the light blocking structure 140 of FIGS. 8A and 8B, the light blocking structure 140 may not include the light blocking part 142 made of an opaque material.

The light blocking structure 140a may be a neutral density (ND) filter. The ND filter is also called an ND gradient filter or a gradient ND filter. The ND filter may have a function of reducing transmittance of light as a distance to the center thereof is shorter. In other words, when light passes through the ND filter, a transmittance value of light may be low in the center of the ND filter, and a transmittance value of light may be high in the periphery of the ND filter. For example, in FIG. 9B, a transmittance value in a light blocking part Ab ranging from the center to a first radius R1 may be about 40% or less, and a transmittance value in a light transmission part At ranging from the first radius R1 to a second radius R2 may be about 95% or more. Therefore, after passing through the ND filter, light intensity in the center may be low and light intensity in the peripheral portion may be high.

According to the present example embodiment, since the optical filter (e.g., the ND filter), in which the transmittance value of light is low in the center, is used as the light blocking structure 140a, the tube-type lens 100b may perform a similar function to the light blocking structure 140 of FIG. 8A. However, in the tube-type lens 100b according to the present example embodiment, since the light blocking structure 140a does not completely block light in the central portion, the light intensity of greater than zero may be detected in a light intensity test of a similar arrangement structure as illustrated in FIG. 5A or FIG. 6C.

Figure 10A:
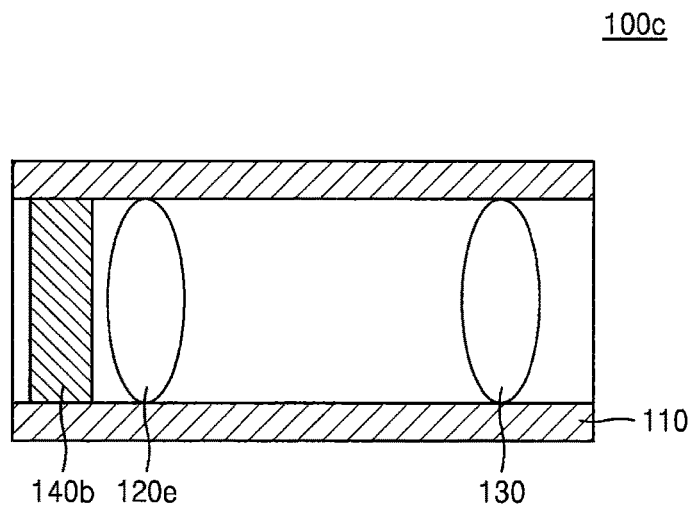
FIG. 10A is a cross-sectional view of a tube-type lens according to another example embodiment of the inventive concept.
Figure 10B:
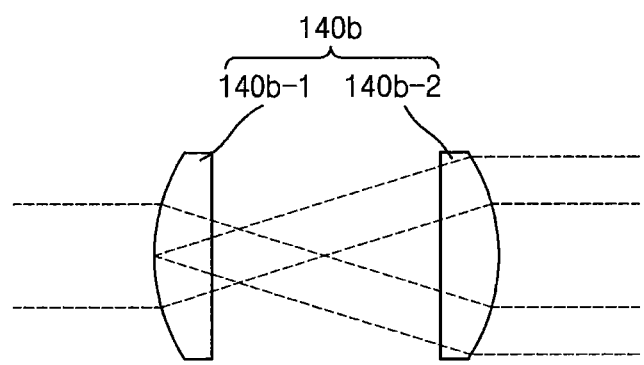
FIG. 10B is a cross-sectional view of a light blocking structure included in the tube-type lens of FIG. 10A.
Figure 10C:
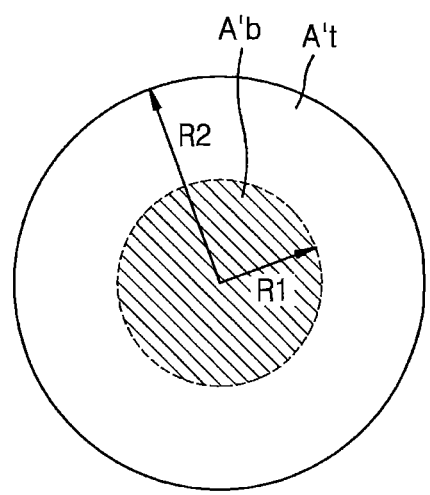
FIG. 10C is a conceptual diagram illustrating intensity of light passing through the light blocking structure.

FIG. 10A is a cross-sectional view of a tube-type lens 100c according to another example embodiment of the inventive concept, FIG. 10B is a cross-sectional view of a light blocking structure 140b included in the tube-type lens 100c of FIG. 10A, and FIG. 10C is a conceptual diagram illustrating intensity of light passing through the light blocking structure 140b. Herein, the descriptions provided with reference to FIGS. 1A to 9B will be provided briefly or will be omitted.

The tube-type lens 100c of FIGS. 10A to 10C may be similar to the tube-type lens 100a or 100b of FIG. 8A or 9A in that the light blocking structure 140b is further included in front of a first lens 120e. However, the function and structure of the light blocking structure 140b may be different from those of the light blocking structure 140 or 140a of the tube-type lens 100a or 100b of FIG. 8A or 9A.

For example, in the tube-type lens 100c according to the present example embodiment, the light blocking structure 140b may be an optical element configured to convert incident light into ring-shaped light. As illustrated in FIG. 10C, the ring-shaped light may mean a beam in which light is distributed in a donut or circular ring shape, when viewed on a cross-section perpendicular to a traveling direction of light. Therefore, as illustrated in FIG. 10C, light passing through the light blocking structure 140b has intensity of substantially zero in a light blocking part A'b ranging from a center to a first radius R1 and may have high intensity in a light transmission part A't ranging from the first radius R1 to a second radius R2. For example, the intensity of light in the light transmission part A't may be similar to or greater than intensity of light passing through a general glass.

As illustrated in FIG. 10B, the light blocking structure 140b may be formed using one pair of axicon lens 140b-1 and 140b-2. Alternatively, the light blocking structure 140b may be formed using elements other than the axicon lenses, for example, a spatial light modulator (SLM). The SLM may convert incident light into ring-shaped light.

According to the present example embodiment, since the optical element (e.g., one pair of axicon lens), which converts incident light into ring-shaped light, is used as the light blocking structure 140b, the tube-type lens 100c may perform a similar function to the light blocking structure 140 of FIG. 8A. In other words, since the light blocking structure 140b blocks the light traveling toward the central portion through the light blocking part A'b, the tube-type lens 100c may block the light traveling toward the central portion of the first lens 120e, thus preventing the light from passing through the central portion of the first lens 120e.

Figure 11A:
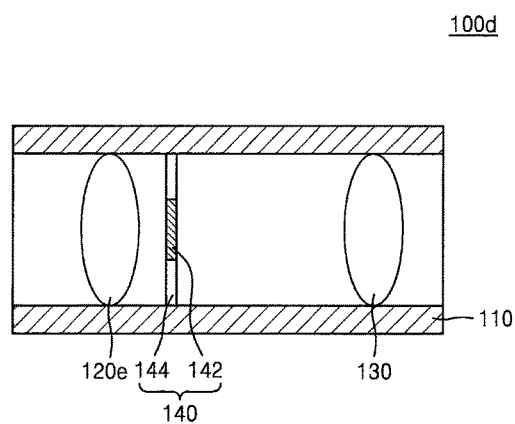
FIGS. 11A and 11B are cross-sectional diagrams of tube-type lenses according to example embodiments.
Figure 11B:
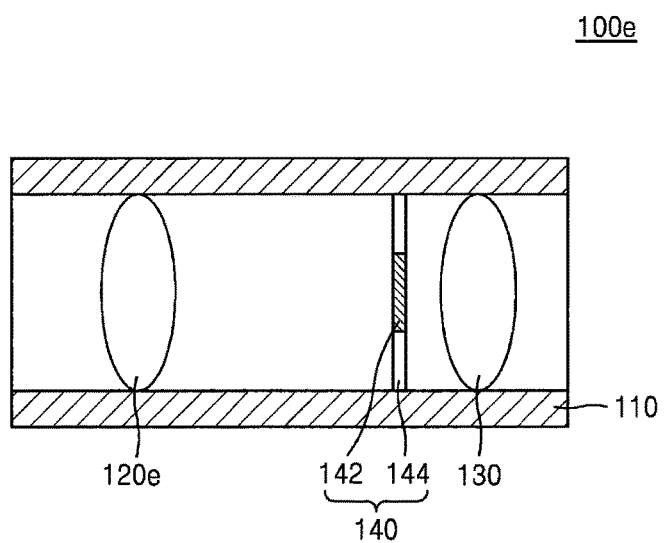

FIGS. 11A and 11B are cross-sectional diagrams of tube-type lenses 100d and 100e according to example embodiments. Herein, the descriptions provided with reference to FIGS. 1A to 10C will be provided briefly or will be omitted.

The tube-type lens 100d of FIG. 11A may differ from the tube-type lens 100a of FIG. 8A in that a light blocking structure 140 is disposed in the rear of a first lens 120e. For example, in the tube-type lens 100d according to the present example embodiment, the light blocking structure 140 may have the same configuration as the light blocking structure 140 of the tube-type lens 100a of FIG. 8A, but may be disposed in the rear of the first lens 120e. That is, the light blocking structure 140 may be disposed adjacent to the first lens 120e in a direction of the second lens 130.

Even when the light blocking structure 140 is disposed in the rear of the first lens 120e, light passing through the central portion of the first lens 120e is blocked by a light blocking part 142 of the light blocking structure 140, thus obtaining the same effect that prevents light from passing through the central portion of the first lens 120e. On the other hand, the light blocking structure 140 may be replaced with the light blocking structure 140a or 140b of FIG. 9A or 10A.

The tube-type lens 100e of FIG. 11B may be similar to the tube-type lens 100d of FIG. 11A in that a light blocking structure 140 is disposed in the rear of a first lens 120e. However, the tube-type lens 100e of FIG. 11B may differ from the tube-type lens 100d of FIG. 11A in that the light blocking structure 140 is disposed more adjacent to a second lens 130 than the first lens 120e. It can be said that the tube-type lens 100e according to the present example embodiment prevents light from passing through the central portion of the second lens 130 rather than blocks light having passed through the central portion of the first lens 120e. Even when the light blocking structure 140 is disposed as described above, light having passed through the central portion of the first lens 120e is prevented from being incident on the optical fiber (see 300 of FIG. 3), thus obtaining the same effect that prevents light from passing through the central portion of the first lens 120e. On the other hand, in the tube-type lens 100e according to the present example embodiment, the light blocking structure 140 may be replaced with the light blocking structure 140a or 140b of FIG. 9A or 10A.

Figure 12A:
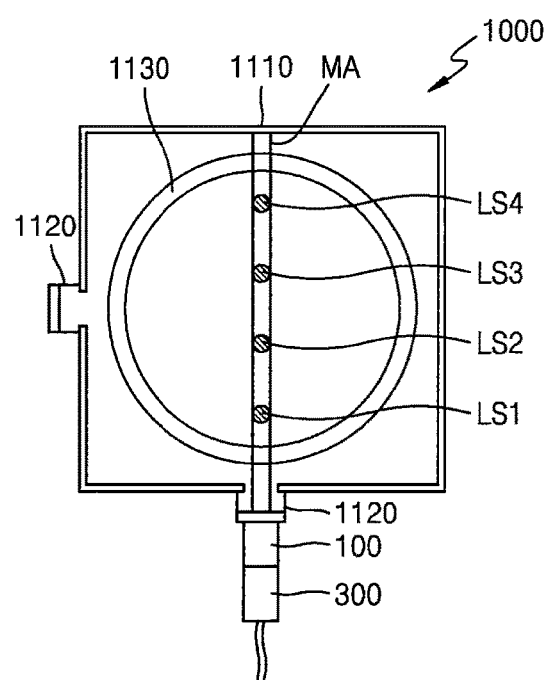
FIGS. 12A and 12B are conceptual diagrams illustrating a principle of measuring an abnormal state of plasma in a local region in a chamber by using an OES apparatus including a tube-type lens, according to the present example embodiment.
Figure 12B:
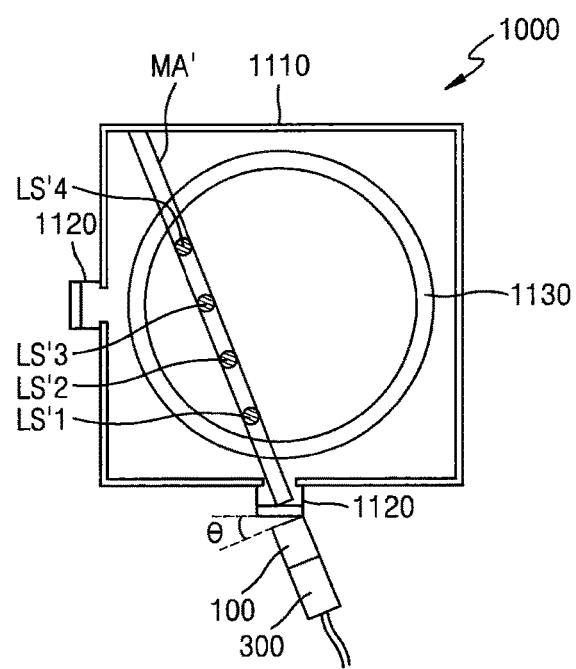

FIGS. 12A and 12B are conceptual diagrams illustrating a principle of measuring an abnormal state of plasma in a local region in a chamber 1110 by using an OES apparatus (see 500 of FIG. 16) including a tube-type lens 100, according to the present example embodiment. For convenience, in the OES apparatus, only an optical fiber part and a tube-type lens part are illustrated. Herein, the descriptions provided with reference to FIGS. 1A to 11B will be provided briefly or will be omitted.

Figure 16:
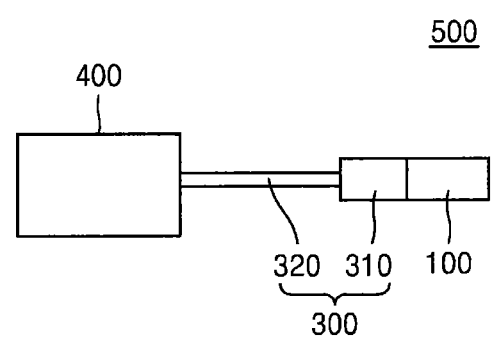
FIG. 16 is a configuration diagram of an OES apparatus including a tube-type lens, according to an example embodiment.

Referring to FIGS. 12A and 12B, the tube-type lens 100 according to the present example embodiment may be coupled to a front end of the optical fiber 300 to thereby constitute the OES apparatus (see 500 of FIG. 16). The tube-type lens 100 may be attached to a viewport 1120 of the chamber 1110. An entrance (see S1 of FIG. 1A) of the tube-type lens 100 may be attached to the viewport 1120, and an exit (see S2 of FIG. 1A) of the tube-type lens 100 may be coupled to the optical fiber 300.

The tube-type lens 100 may be attached to the viewport 1120 in an easily attachable/detachable structure. For example, a structure for screw coupling, hook coupling, or wedge coupling may be formed on the entrance side of the tube-type lens 100, and a counterpart structure may be formed in the viewport 1120. If necessary, an outer surface of the viewport 1120 may be formed to have a groove structure. That is, the outer surface of the viewport 1120 may be recessed inwardly from a wall surface of the chamber 1119. In a case where the outer surface of the viewport 1120 is formed to have the groove structure, the tube-type lens 100 may be formed such that an outer shape thereof is fitted into a groove of the viewport 1120, and the tube-type lens 100 may be coupled to the viewport 1120 by simply fitting into the groove. In addition, a vacuum sucker structure may be installed on the outer surface of the tube 110 of the tube-type lens 100, and the tube-type lens 100 may be coupled to the viewport 1120 through a vacuum lift principle.

Figure 18A:
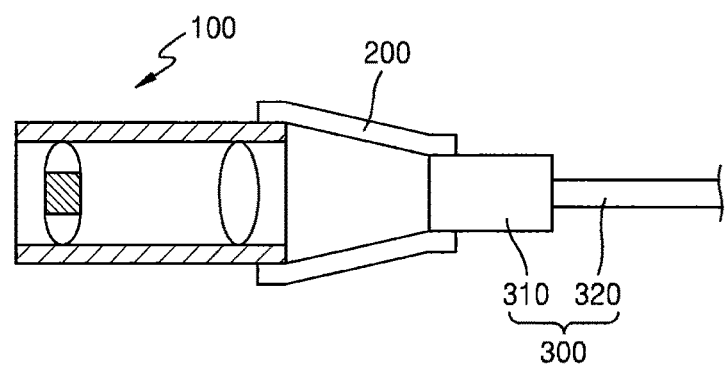
FIGS. 18A and 18B are cross-sectional views illustrating a coupling structure of a tube-type lens and an optical fiber in the OES apparatus of FIG. 16.
Figure 18B:
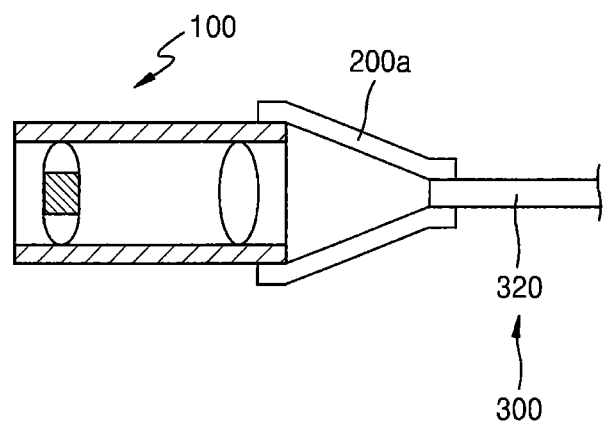

On the other hand, the tube-type lens 100 may be coupled to the optical fiber 300 by using a coupling guide (see 200 or 200a of FIG. 18A or 18B). The coupling between the tube-type lens 100 and the optical fiber 300 will be described in detail with reference to FIGS. 18A to 18C.

When the tube-type lens 100 according to the present example embodiment is attached to the viewport 1120, plasma light of a narrow region may be incident on the tube-type lens 100 due to the structure of the tube-type lens 100. The region of the plasma light incident on the tube-type lens 100 may depend on the structure of the tube-type lens 100 and the focal point of the first lens 120. The region of the plasma light incident on the tube-type lens 100 cannot be exactly defined, but approximate measurement regions MA and MA' may be defined based on the inner diameter (see D of FIG. 1A) of the tube-type lens 100 and the focal length of the first lens 120.

In FIGS. 12A and 12B, regions having the same width are defined as the measurement regions MA and MA', but the structures of the measurement regions MA and MA' are not limited thereto, and any suitable structure of the measurement regions may be used. For example, the measurement regions MA and MA' may be defined by a structure that is tapered toward one direction. Alternatively, as illustrated in FIG. 4B, the measurement regions MA and MA' may be defined by a structure that is narrowed toward the center and is widened in both directions. Since the plasma light is generated in the entire measurement regions, each point of the measurement regions MA and MA' may correspond to plasma light sources. If the plasma light sources are selected through excessive subdivision, a measuring process and a calculating process become complicated. Accordingly, some points of the measurement regions MA and MA' may be selected as plasma light sources (LS1, LS2, LS3, and LS4 in FIG. 12A, or LS'1, LS'2, LS'3, and LS'4 in FIG. 12B), based on the focal point of the first lens 120 and the size of the light blocking unit 122. Then, a plasma state may be analyzed by detecting plasma light with respect to the selected plasma light sources.

FIG. 12A illustrates a case where the surface of the entrance of the tube-type lens 100 is horizontally coupled to the outer surface of the viewport 1120. Therefore, a region perpendicular to the surface of the entrance of the tube-type lens 100 may be defined as the measurement region MA, and the plasma light of the measurement region MA may be incident on the tube-type lens 100.

In contrast, FIG. 12B illustrates a case where the surface of the entrance of the tube-type lens 100 is coupled to the outer surface of the viewport 1120 at a first slope θ. The first slope θ may be less than 90°. Although the first slope according to the structure of the viewport 1120 of the chamber 1110 may be changed, the first slope θ may be in the range of about 0° to about 60°. In a case where the tube-type lens 100 is coupled to the viewport 1120 at the first slope θ as described above, a region perpendicular to the surface of the entrance of the tube-type lens 100 may be defined as the measurement region MA', and the plasma light of the measurement region MA' may be incident on the tube-type lens 100.

Figure 13A:
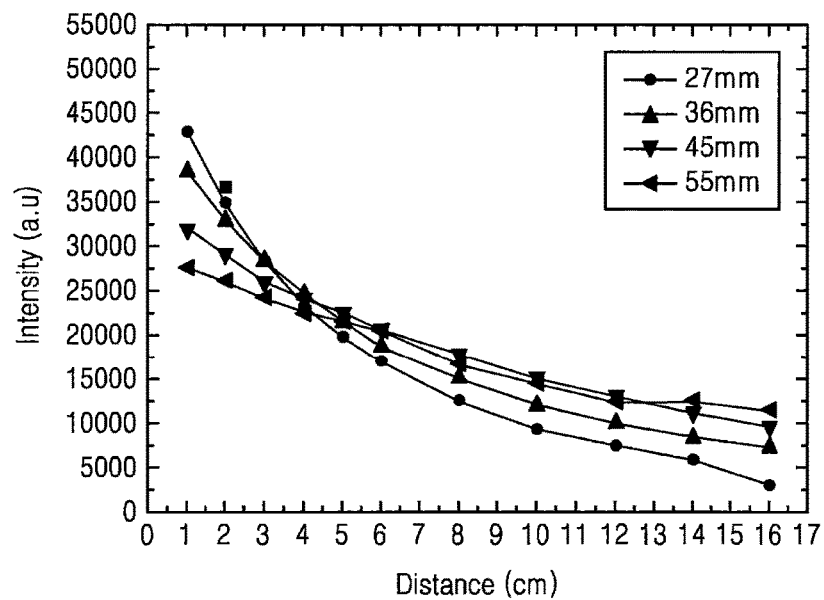
FIGS. 13A and 13B are graphs showing intensity of light measured according to a distance while changing a focal point in an OES apparatus including a general focus lens and an OES apparatus including a tube-type lens according to the present example embodiment.
Figure 13B:
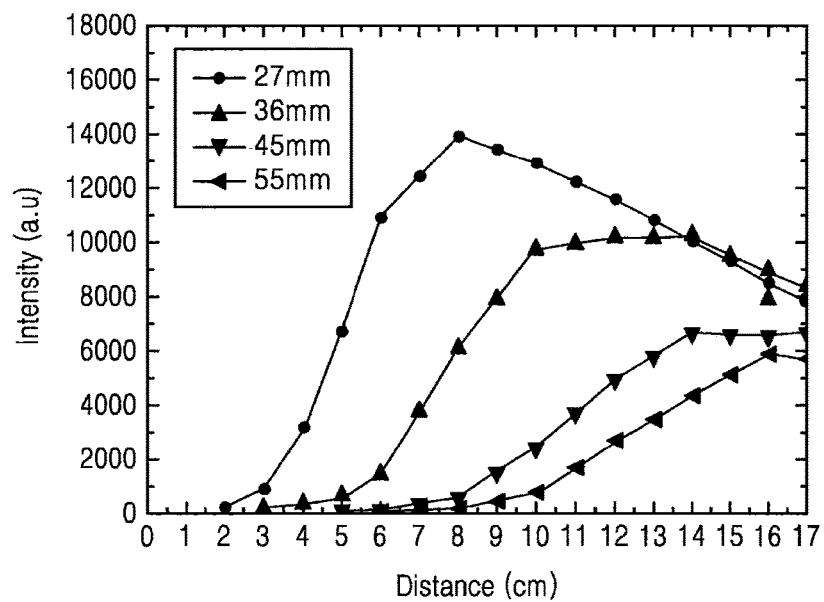

FIGS. 13A-13B are graphs showing intensity of light measured according to a distance while changing a focal point in an OES apparatus including a general focus lens and an OES apparatus including a tube-type lens according to the present example embodiment. In FIGS. 13A-13B, an x axis represents a distance from a light source, and a y axis represents measured light intensity. For ease of understanding, FIGS. 2, 12A, and 12B also will be referenced herein.

Referring to FIG. 13A, in the case of the OES apparatus including the general focus lens, the intensity of light is gradually reduced as the distance from the light source increases. In addition, in the case of using lenses having different focal points, light intensity is slightly different according to a distance, but light intensity tends to be reduced as a distance from the light source increases. With regard to lenses having different focal points, the total light intensity obtained by summing light intensities at all positions exhibits substantially the same value. For example, when a lens (●) having a focal length of 27 mm is used, light intensity is high at a point close to the light source, but a reduction in the light intensity is great as a distance from the light source increases. On the other hand, when a lens (□) having a focal length of 55 mm is used, light intensity is not high at a point close to the light source, but a reduction in the light intensity is not great even when a distance from the light source increases. Therefore, if light intensities at all points are summed with regard to the respective lenses, a substantially similar value may be exhibited.

The same result may be obtained even when the lens is fixed and a plurality of light sources are disposed at each distance. More specifically, in the case of the configuration in which the plurality of light sources are disposed at each distance, light from all the light sources is incident on a general focus lens at a time. This may be similar to the result obtained when light intensities at all positions with respect to the single light source are summed. Therefore, in the configuration in which the plurality of light sources are disposed at each distance, the same or similar light intensity may be detected when light intensity is measured by using general focus lenses having different focal points.

This result may equally appear even when plasma light in the chamber is measured. For example, similarly to the case of FIG. 12, when assuming that the measurement regions MA are defined as a narrow line shape and plasma light is present at the respective measurement regions MA, the same light intensity is detected if the plasma light is measured by using general focus lenses having different focal points. Thus, it may be impossible to analyze a plasma state of a specific position.

In the FIG. 13B, the OES apparatus includes the tube-type lens according to the present example embodiment, and the intensity of light appears differently from the case shown in FIG. 13A of using the general focus lens.

Specifically, in the case of the OES apparatus including the tube-type lens according to the present example embodiment, the intensity of light is maintained at substantially zero until a predetermined distance from a light source and then gradually increases. The intensity of light decreases again after passing through a peak point having a maximum value. For example, in a case where a lens (●) having a focal length of 27 mm is used as the first lens 120 of the tube-type lens 100 of FIG. 1A, the intensity of light is maintained at substantially zero until a distance of 2 cm from the light source. Then, the intensity of light gradually increases and exhibits a maximum value at a peak point, at a distance of about 8 cm. Then, the intensity of light decreases again. Although the intensity of light is different at each position and peak points are different, the above result may be similarly exhibited with respect to lens having different focal lengths.

For reference, that the intensity of light is substantially zero at a position close to the light source may be easily expected from the arrangement structure of FIG. 5A or the arrangement structure of FIG. 6C. In other words, in a case where the light source is disposed close to the first lens 120, most of light is blocked by the light blocking unit 122. Thus, the intensity of light may be substantially zero. On the other hand, as described above with reference to FIG. 2, in the case of the light intensities at positions having light intensity greater than zero, the paths of light directed toward the light blocking unit 122 may be excluded from the calculation of the intensity in Equation (1) due to the presence of the light blocking unit 122 in the central portion of the first lens 120. Thus, it may be expected that the light intensity at all positions is low as compared with the case shown in FIG. 13A of using the general focus lens.

As described above with reference to FIGS. 5A-5C, the peak point at which the intensity of light becomes maximum may depend on the size of the light blocking unit 122 rather than the matching or mismatching between the position of the light source and the focal point of the first lens 120. For example, in a case where the size of the light blocking unit 122 is small, the peak point of the light intensity may move to left, i.e., a position close to the light source. On the contrary, in a case where the size of the light blocking unit 122 is large, the peak point of the light intensity may move to right, i.e., a position far from the light source. In addition, the intensity of light converges to a predetermined value as the distance from the light source increases, regardless of the focal length. As the distance from the light source greatly increases, the intensity of light converges to zero like the case illustrated in FIG. 13A.

On the other hand, unlike the case illustrated in FIG. 13A, with regard to lenses having different focal points, the total light intensity obtained by summing light intensities at all positions exhibits different values. This may be easily expected from an area covered by graphs drawn by the lenses corresponding to the respective focal points. Therefore, in the case of the OES apparatus including the tube-type lens according to the present example embodiment, it is expected that it is possible to detect whether the plasma light is normal or abnormal according to the distance from the light source. These will be described below in more detail with reference to FIGS. 12A to 15B.

Figure 14A:
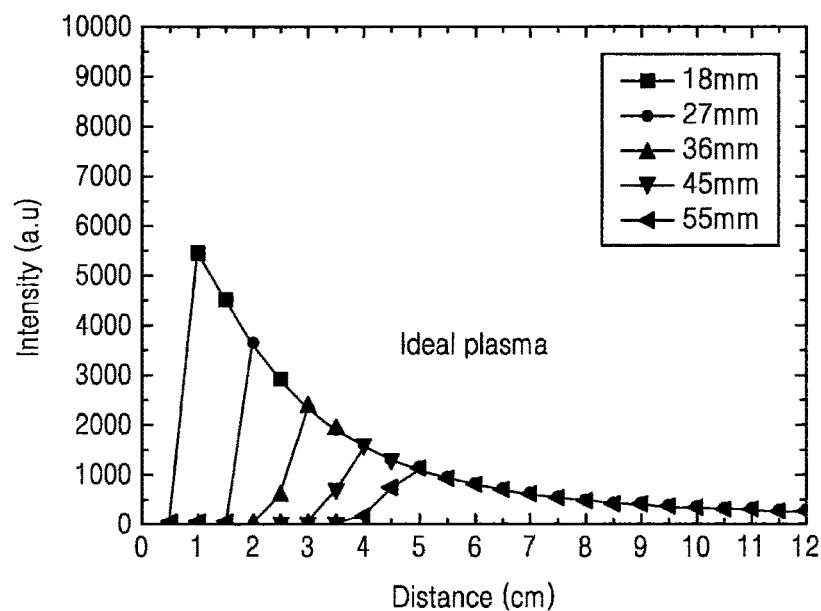
FIGS. 14A and 14B are graphs showing quantified intensity of ideal plasma light in a local region in a chamber based on an OES apparatus including a tube-type lens according to the present example embodiment.
Figure 14B:
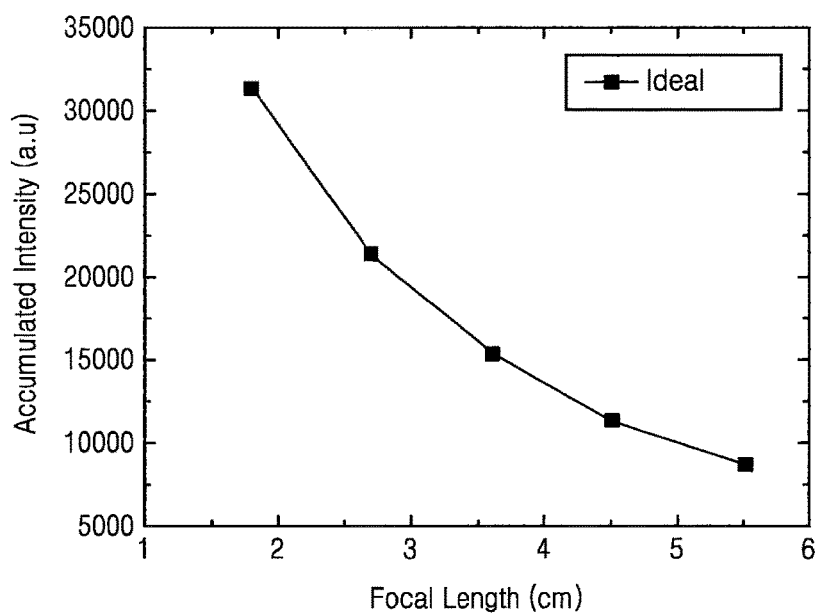

FIGS. 14A and 14B are graphs showing quantified intensity of ideal plasma light in a local region in a chamber based on an OES apparatus including a tube-type lens according to the present example embodiment. FIG. 14A is a graph showing quantified intensity of light at each distance from the light source while changing the focal length of the first lens, and FIG. 14B is a graph showing quantified accumulated intensity of light with respect to each focal point of the first lens.

Referring to FIG. 14A, the intensity of ideal plasma light of the local region in the chamber, e.g., the measurement regions MA and MA' of FIG. 12A or 12B, is quantified at each distance with respect to each focal point of the first lens (120 of FIG. 1A). A pattern of the quantified graph may appear similar to a pattern of the graph of FIG. 13B. That is, with respect to each focal point of the first lens, the intensity of light tends to abruptly increase to the maximum value of the peak point at zero and then gradually decrease.

For example, the quantified graph of FIG. 14A may be a graph obtained by simulation calculation based on Equation (1) on the assumption that plasma light sources of the ideal state in the chamber are disposed in the measurement regions, unlike FIG. 13B. The plasma light source of the ideal state may correspond to a plasma light source that generates plasma light having light intensity in an allowable range in a plasma process.

On the other hand, compared with FIG. 13B, when viewed from the pattern in which the focal points of the first lens 120 are the same, but the position of the peak point is close to the light source and the intensity of light abruptly increases to the peak point, it is expected that it is obtained by quantifying the intensity of light by using the first lens 120 in which the size of the light blocking unit (122 of FIG. 1A) is large. In addition, the quantification of the light intensity of FIG. 14A is performed such that each position of the peak points approaches each focal point of the first lens 120.

FIG. 14B is a quantified graph of the accumulated intensity of light which is obtained by summing all light intensities at each distance from the light source with respect to each focal point of the first lens 120. The graph of FIG. 14B may be generated by summing all light intensities at each distance with respect to each focal point of the first lenses 120 of FIG. 14A. Specifically, it can be confirmed that the accumulated intensity of light obtained by summing all light intensities at each distance with respect to the first lens 120 having a focal length of 18 mm are highest and the accumulated intensity of light obtained by summing all light intensities at each distance with respect to the first lens 120 having a focal length of 55 mm are lowest. This result may be easily expected, taking into consideration the area surrounded by the graphs of the light intensities at each distance with respect to each focal length of the first lens 120 of as illustrated in FIG. 14A.

Figure 15A:
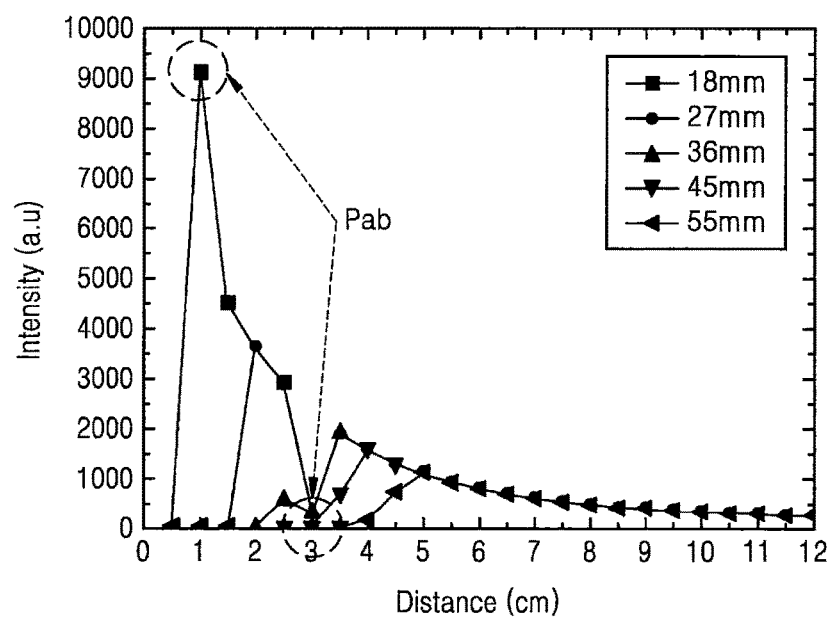
FIGS. 15A and 15B are graphs for describing a determination as to an abnormal state of plasma in a local region by actually measuring intensity of plasma light in a local region in a chamber by using an OES apparatus including a tube-type lens according to the present example embodiment and comparing the measured intensity of the plasma light with the quantified graphs of FIGS. 14A and 14B.
Figure 15B:
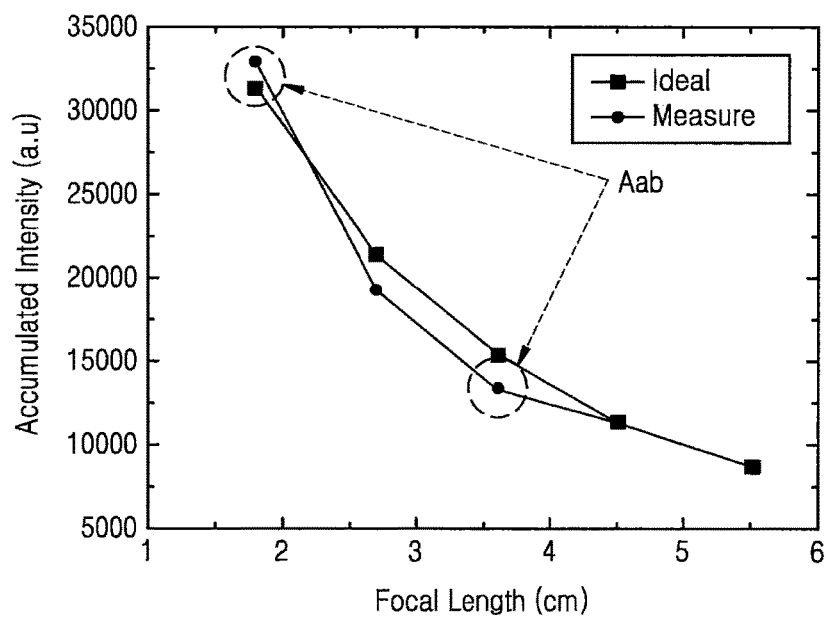

FIGS. 15A and 15B are graphs for describing a determination as to an abnormal state of plasma in the local region by actually measuring intensity of plasma light in the local region in the chamber by using the OES apparatus including the tube-type lens according to the present example embodiment and comparing the measured intensity of the plasma light with the quantified graphs of FIGS. 14A-14B.

Referring to FIGS. 15A-15B, it is possible to detect that an abnormal plasma state occurs in regions indicated by dashed circles Pab by comparing a result obtained by measuring light intensity at each distance while changing a focal length of the first lens (120 of FIG. 1A) as illustrated in FIG. 15A with the quantified graph of the ideal plasma state of FIG. 14A.

The determination as to the abnormality of the plasma state through the comparison between the graph of FIG. 14A and the graph of FIG. 15A is merely a hypothetical method. That is, the plasma light measured through the OES apparatus including the tube-type lens according to the present example embodiment is not measured separately at each distance, but is measured by summing light from all plasma light sources included in the measurement range. Therefore, it may be difficult to actually acquire the graph of FIG. 15A, that is, the graph of the light intensity at each distance by using the OES apparatus including the tube-type lens according to the present example embodiment.

Consequently, the accumulated light intensity (●: Measure) with respect to the focal points of the first lens 120 may be measured through the OES apparatus including the tube-type lens according to the present example embodiment, as illustrated in FIG. 15B. Therefore, the abnormality of the plasma state may be determined by comparing the graph for the measured accumulated light intensity with the quantified graph of the accumulated light intensity with respect to the ideal plasma of FIG. 13B. For example, it can be confirmed that an abnormal plasma state has occurred in regions corresponding to the first and third focal lengths (18 mm, 36 mm) of the first lens. It can be confirmed that the plasma state was normal in regions corresponding to the fourth and fifth focal lengths (45 mm, 55 mm).

By using this principle the OES apparatus including the tube-type lens according to the present example embodiment may detect the abnormal plasma state in a specific region in the chamber. In addition, in FIG. 14A, the focal points of the first lens and the position of the plasma light source of the peak point are quantified to correspond to a substantially similar position, but the position of the plasma light source of the peak point may correspond to a position that is several times farther away than the distance of the focal point of the first lens. In addition, even when the focal points of the first lens and the position of the plasma light source of the peak point substantially similarly correspond to each other, the position of the plasma light source of the peak point may correspond far away by using the first lens having the focal point of a long distance.

Figure 17:
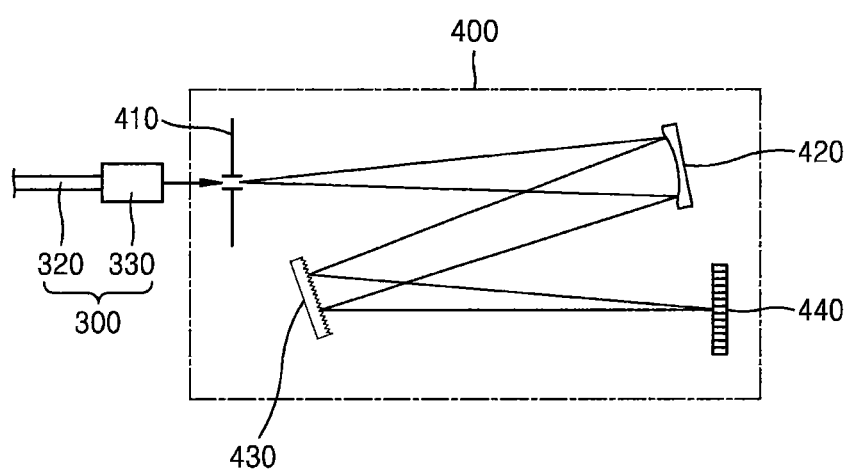
FIG. 17 is a configuration diagram of a spectroscope in the OES apparatus of FIG. 16.

FIG. 16 is a configuration diagram of an OES apparatus 500 including a tube-type lens 100, according to an example embodiment, and FIG. 17 is a configuration diagram of a spectroscope 400 in the OES apparatus 500 of FIG. 16. Herein, the descriptions provided with reference to FIGS. 1 to 15 will be provided briefly or will be omitted.

Referring to FIGS. 16 and 17, the OES apparatus 500 according to the present example embodiment may be an apparatus capable of OES and may include the tube-type lens 100, an optical fiber 300, and the spectroscope 400. The tube-type lens 100 may be the tube-type lens 100 described with reference to FIGS. 1A to 1C. The OES apparatus 500 according to the present example embodiment may include any one of the tube-type lenses 100a to 100e according to the above-described example embodiments, instead of the tube-type lens 100 of FIG. 1A.

The optical fiber 300 may include an optical fiber coupling unit 310 and an optical cable 320. The optical fiber coupling unit 310 is configured to optically couple the optical fiber to other optical element. In the OES apparatus according to the present example embodiment, the optical fiber coupling unit 310 may be coupled to the tube-type lens 100. Since the coupling structure of the optical fiber coupling unit 310 and the tube-type lens 100 and the structure of the optical cable 320 will be described with reference to FIGS. 18A and 18B, detailed descriptions thereof will be omitted. On the other hand, as illustrated in FIG. 17, the optical fiber 300 may include an optical fiber coupling unit 330 so as to couple to the spectroscope 400.

The spectroscope 400 may include an incidence aperture 410, an imaging mirror 420, a diffraction grating 430, and an array detector 440. In the configuration of the spectroscope 400, light is incident from the optical fiber 300 to the incidence aperture 410, and light dispersed from the incidence aperture 410 is collected by the imaging mirror 420 to thereby form an image of the incidence aperture 410. A planar diffraction grating may be commonly used as the diffraction grating 430. The planar diffraction grating 430 may be disposed on an optical path, and the array detector 440 may be disposed at a position where the image of the incidence aperture 410 is formed. Accordingly, the converging light may be spectroscopically decomposed after the incidence on the planar diffraction grating 430 and an image may be formed at another position of the array detector 440 according to a wavelength. The array detector 440 may be a charge-coupled device (CCD).

The configuration of the spectroscope 400 of FIG. 17 is merely an example and spectroscopes having various configurations may be applied to the OES apparatus 500 according to the present example embodiment. For example, the spectroscope 400 may include, instead of the imaging mirror 420, a collimating mirror configured to parallelize light output from the incidence aperture 410 and transfer parallel light to the diffraction grating 430, a focusing mirror configured to collect light spectroscopically decomposed by the diffraction grating 430 and transfer the collected light to the array detector 440, and an order alignment filter disposed in front of the array detector 440.

Data about the spectroscopically decomposed light received through the array detector 440 of the spectroscope 400 may be transferred to an analyzer (see 700 of FIG. 19) and be used to analyze the plasma state. The OES apparatus 500 according to the present example embodiment includes the optical fiber 300, but an OES apparatus 500a may not include an optical fiber as illustrated in FIG. 20. In this case, a spectroscope 400 of the OES apparatus 500a may be directly coupled to the tube-type lens 100.

Figure 18C:
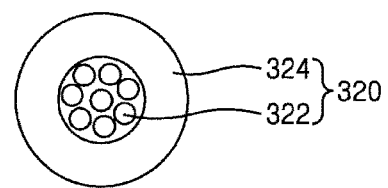
FIG. 18C is a cross-sectional view of the optical fiber.

FIGS. 18A and 18B are cross-sectional views illustrating the coupling structure of the tube-type lens 100 and the optical fiber 300 in the OES apparatus 500 of FIG. 16, and FIG. 18C is a cross-sectional view of the optical fiber 300. Herein, the descriptions provided with reference to FIGS. 1 to 17 will be provided briefly or will be omitted.

Referring to FIG. 18A, the tube-type lens 100 may be coupled to the optical fiber 300 through the coupling guide 200. The coupling guide 200 may be configured to cover the periphery of the tube 110 of the tube-type lens 100 and the optical fiber coupling unit 310 of the optical fiber 300. The configuration of the coupling guide 200 is merely an example and is not limited thereto. Any suitable configuration of the coupling guide may be used. For example, the coupling guide 200 may have various configurations for coupling the tube-type lens 100 and the optical fiber 300. On the other hand, the position of the focal point of the second lens 130 of the tube-type lens 100 may be on an incident surface of the optical fiber 300 on which light is incident, e.g., an incident surface of the optical cable 320.

Referring to FIG. 18B, the optical fiber 300 may not include the optical fiber coupling unit. In this case, the tube-type lens 100 may be directly coupled to the optical cable 320 by using the coupling guide 200a. In the case of the configuration in which the tube-type lens 100 is directly coupled to the optical cable 320, the focal point of the second lens 130 of the tube-type lens 100 may be disposed on the incident surface of the optical cable 320. The cross-section of the optical cable 320 is simply illustrated in FIG. 18C, and the optical cable 320 may include an optical fiber bundle in a central portion thereof and a cladding layer 324 in a peripheral portion thereof. The cladding layer 324 may surround the optical fiber bundle 322 and protect the optical fiber bundle 322. The optical fiber bundle 322 may include one to eight unit optical fibers. The number of the unit optical fibers is not limited thereto, and any suitable number of optical fibers may be used. The unit optical fiber may transfer incident light through total reflection. The optical fiber bundle 322 may be made of optical fibers made of various materials, including a silica-based optical fiber, a fluorine-based optical fiber, a rare earth-based optical fiber, a plastic cladding optical fiber, and a plastic optical fiber.

Figure 19:
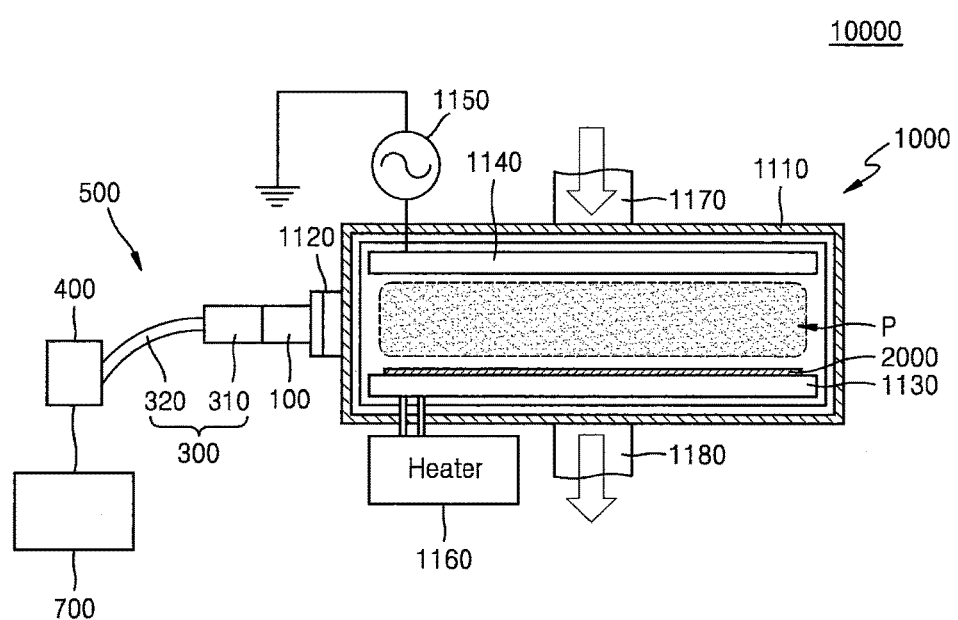
FIGS. 19 and 20 are configuration diagrams of plasma monitoring systems including an OES apparatus, according to example embodiments of the inventive concept.
Figure 20:
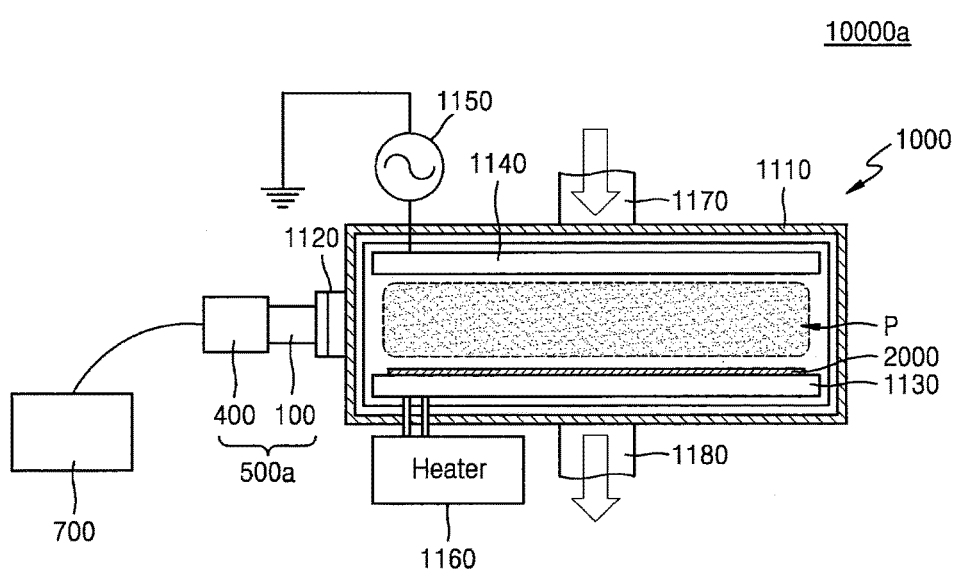

FIG. 19 is a configuration diagram of a plasma monitoring system 10000 including an OES apparatus 500 with an optical fiber, according to an example embodiment of the inventive concept, and FIG. 20 is a configuration diagram of a plasma monitoring system 10000a including an OES apparatus 500a without an optical fiber, according to an example embodiment of the inventive concept. Herein, the descriptions provided with reference to FIGS. 1 to 18 will be provided briefly or will be omitted.

Referring to FIGS. 19 and 20, the plasma monitoring systems 10000 and 10000a according to the present example embodiment may include the OES apparatuses 500 and 500a, chamber systems 1000, analyzers 700, respectively. In the plasma monitoring system 10000 of FIG. 19, the OES apparatus. 500 may be the OES apparatus 500 of FIG. 16. On the other hand, in the plasma monitoring system 10000a of FIG. 20, the OES apparatus 500a may not include the optical fiber. Therefore, a spectroscope 400 may be directly coupled to a tube-type lens 100.

Since the OES apparatuses 500 and 500a and the elements thereof have been described above, detailed descriptions thereof will be omitted. In addition, the plasma monitoring system 10000 of FIG. 19 is substantially identical to the plasma monitoring system 10000a of FIG. 20, except for the OES apparatuses 500 and 500a coupled to viewports 1120 of the chambers 1110. Hereinafter, the plasma monitoring systems 10000 and 10000a of FIGS. 19 and 20 will be collectively described.

The chamber system 1000 may include the chamber 1110, the viewport 1120, an electrostatic chuck 1230, a shower head 1140, a radio frequency (RF) power supply 1150, a heater 1160, a process gas inlet 1170, and a turbo pump 1180.

The chamber 1110 may be a chamber for a plasma process. For example, the chamber 1110 may be a capacitively coupled plasma (CCP) chamber. However, the chamber 1110 is not limited to the CCP chamber. For example, the plasma monitoring system 10000 according to the present example embodiment may include various chambers, such as an inductively coupled plasma (ICP) chamber, an electron cyclotron resonance (ECR) plasma chamber, a surface wave plasma (SWP) chamber, a helicon wave plasma chamber, and an e-beam plasma chamber. The peripheral devices, including the chamber 1110, may be changed according to the chamber system 1000. In the case of the ICP chamber, upper and lower RF power supplies are provided. The upper RF power supply includes a coil to generate a magnetic field in the chamber by supplying RF power. The use of the magnetic field may accelerate the generation of plasma in the chamber.

The plasma may be divided into low-temperature plasma and thermal plasma according to a temperature. The low-temperature plasma may be used in a semiconductor process, such as a semiconductor manufacturing process, a metal and ceramic thin film manufacturing process, and a material synthesizing process. The thermal plasma may be used to cut a metal. The low-temperature plasma may be subdivided into atmospheric plasma, vacuum plasma, and next-generation plasma according to applied fields. An atmospheric plasma technology may mean a technology that generates low-temperature plasma while maintaining a pressure of gas in the range of about 100 Torr to atmospheric pressure (760 Torr). The atmospheric plasma technology may be used for surface modification, cleaning of a display panel, and an LCD light source. A vacuum plasma technology may mean a technology that generates low-temperature plasma while maintaining a pressure of gas at about 100 Torr or less. The vacuum plasma technology may be used for dry etching, thin film deposition, PR aching, and ALD growth in a semiconductor process and may be used for etching and thin film deposition on a display panel in a display process. The next-generation plasma technology may mean a technology that generates low-temperature plasma usable for the generation of advanced-concept low-temperature plasma and/or next-generation new technology.

At least one viewport 1120 may be formed in the chamber 1110, and the inside of the chamber 1110 may be monitored through the viewport 1120. For example, in the plasma monitoring systems 10000 and 10000a according to the present example embodiment, the tube-type lenses 100 of the OES apparatuses 500 and 500a are non-invasively coupled to the viewports 1120 to monitor the plasma state in the chambers 1110. One viewport 1120 is installed in the chamber 1110, but two or more viewports may be installed according to the chamber system. Here, the term "non-invasively" may mean that the tube-type lens 100 is coupled to an outside of the chamber 1110 instead of invading into the chamber 1110. In addition, since the tube-type lens 100 does not invade into the chamber 1110 and thus does not contact plasma, the non-invasive manner may also be referred to as a non-contact manner.

The electrostatic chuck 1130 may be disposed in a lower portion of the chamber 1110, and a wafer 2000 may be disposed and fixed on the electrostatic chuck 1130. The electrostatic chuck 1130 may fix the wafer 2000 by an electrostatic force.

The shower head 1140 may be disposed in an upper portion of the chamber 1110 and may include a plurality of spray holes through which process gases supplied from the process gas inlet 1170 are sprayed inside the chamber 1110.

The RF power supply 1150 may generate RF power and supply the RF power to the shower head 1140 so as to supply the RF power to the process gases in the chamber 1110. The shower head 1140 may function as an upper electrode. However, an upper electrode may be provided separately from the shower head 1140, and RF power may be supplied to the upper electrode. The RF power supply 1150 may include an RF generator and a matcher. The RF generator may generate RF power, and the matcher may stabilize plasma through impedance adjustment. The matcher may also be referred to as a matching box.

The heater 1160 may heat the wafer 2000 through the coil disposed inside the electrostatic chuck 1130 and/or maintain the chamber at an appropriate temperature.

The process gas inlet 1170 may receive process gases necessary for a gas plasma process from gas sources and supply the process gases to the shower head 1140. The process gases may mean any gases necessary for the plasma process, such as source gases, reaction gases, and purge gases. If necessary, the process gas inlet 1170 may be directly connected to the chamber and directly supply a specific process gas to the chamber 1110.

After the plasma process, the turbo pump 1180 may exhaust the gases from the chamber 1110 through a vacuum pump or the like. In addition, the turbo pump 1180 may adjust an internal pressure of the chamber 1110.

The analyzer 700 may include a personal computer (PC), a workstation, and a supercomputer. An analysis program for analyzing the plasma state may be installed on the analyzer 700. The analyzer 700 may analyze the plasma state in the chamber 1110, in particular, at the local position inside the chamber by using the analysis program, based on data about the plasma light which is received from the OES apparatus 500. The analysis program may include the quantified light intensity graph of the ideal plasma which have been described with reference to FIGS. 14 and 15.

When it is analyzed that the plasma state at the local position is outside of an allowable range, the analyzer 700 may analyze the cause and present new process conditions for the corresponding plasma process. If necessary, the OES apparatus 500 and the analyzer 700 may be collectively referred to as an OES system.

Figure 21:
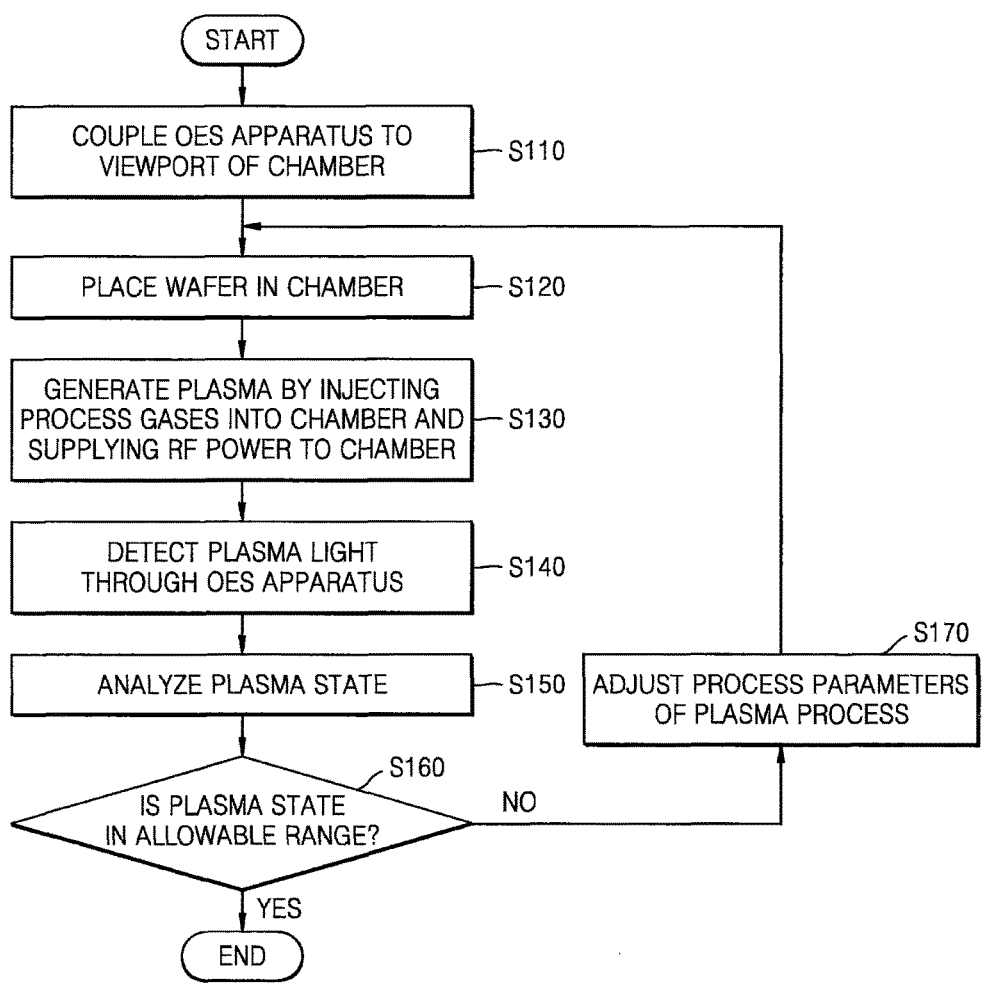
FIG. 21 is a flowchart of a method of monitoring a plasma state and controlling a plasma process, according to an example embodiment of the inventive concept.

FIG. 21 is a flowchart of a method of monitoring a plasma state and controlling a plasma process, according to an example embodiment of the inventive concept. For ease of understanding, FIG. 19 (or FIG. 20) also is referred to.

Referring to FIG. 21, in operation S110, the OES apparatus 500 (500*a*) according to the present example embodiment is coupled to the viewport 1120 of the chamber 1110. The OES apparatus 500 (500*a*) according to the present example embodiment may include any one of the tube-type lenses 100 and 100*a* to 100*e* according to the above-described example embodiments. The coupling of the OES apparatus 500 (500*a*) may be performed by coupling the tube-type lens 100 (100*a* to 1000*e*) to the viewport 1120 through a certain coupling method. The coupling method may include various methods, such as screw coupling, hook coupling, wedge coupling, vacuum lift coupling, and snap coupling. In some cases, the tube 110 of the tube-type lens 100 (100*a* to 100*e*) may be inserted into the viewport 1120 having a concave structure.

When the OES apparatus 500 (500*a*) is coupled to the viewport 1120 of the chamber 1110, the analyzer 700 may be coupled to the OES apparatus 500 (500*a*) and receive data about the plasma light from the OES apparatus 500 (500*a*) in real time. In some cases, the analyzer 700 may be in a state of not being coupled to the OES apparatus 500 (500*a*) and then be coupled to the OES apparatus 500 (500*a*) after the detection of the plasma light, and the analyzer 700 may receive data about the plasma light stored in the OES apparatus 500 (500*a*).

In operation S120, the wafer 2000 may be placed on the electrostatic chuck 1130 inside the chamber 1110. The wafer 2000 may be placed before the coupling of the OES apparatus 500 (500*a*).

In operation S130, plasma may be generated by injecting process gases into the chamber 1110 and supplying RF power to the chamber 1110. The process gases may be injected into the chamber 1110 in such a manner that the process gases transferred from the gas supply sources are sprayed through the shower head 1140 via the process gas inlet 1170. The RF power may be supplied in such a manner that the power supply 1150 supplies the RF power to the shower head 1140. In a case where an upper electrode is provided separately from the shower head 1140, the RF power may be supplied to the upper electrode.

The generation of plasma in this operation may mean that the plasma process is performed using the generated plasma. The plasma process may be etching, deposition, diffusion, surface treatment, and new material synthesis.

The plasma light generated in the chamber 1110 may be detected through the OES apparatus 500 (500*a*). The OES apparatus 500 (500*a*) according to the present example embodiment may detect only plasma light of a specific region inside the chamber 1110 by receiving the plasma light inside the chamber 1110 by using the tube-type lens 100. The determination of the abnormal plasma state of the specific region by detecting the plasma light of the specific region in the chamber 1110 or on the wafer 2000 has been described with reference to FIGS. 12A to 15.

In operation S150, the plasma state may be analyzed based on data about the plasma light detected by the OES apparatus 500 (500*a*). The analysis of the plasma state may be performed through the analyzer 700 in the above-described manner.

In operation S160, it may be determined whether the plasma state is in an allowable range. The determination as to whether the plasma state is within the allowable range may be performed through the analyzer 700. For example, the analyzer 700 may determine whether the plasma state of the specific region in the chamber 1110 is abnormal, by comparing the quantified light intensity graph of the ideal plasma state as illustrated in FIG. 14 with the light intensity measured through the OES apparatus 500 (500*a*). Furthermore, when the plasma state is abnormal, the analyzer 700 may grasp the cause and present new process conditions for the corresponding plasma process.

When it is determined that the plasma state is within the allowable range (Yes), the monitoring of the plasma state may be ended. In operation S170, when it is determined that the plasma state is outside of the allowable range (No), process parameters of the plasma process may be adjusted. For example, the process parameters may be adjusted by increasing or decreasing pressures of the process gases or increasing or decreasing the supplied RF power. The process conditions may be adjusted based on data acquired through a simulation by the analyzer 700. After the process parameters are adjusted, the process returns to operation S120 of placing a new wafer in the chamber 1110. Then, the plasma process and the monitoring may be performed.

In addition, when the plasma state is within the allowable range, a separate process of measuring the wafer 2000 may be omitted. For example, when the measured plasma state is outside of the allowable range, the process of measuring the wafer 2000 may be performed, and a process failure in the plasma process for the wafer 2000, e.g., deposition, etching, and diffusion, may be confirmed through the measuring process. The process of measuring the wafer 2000 may be a process of confirming the abnormal plasma state. However, when it is determined that the plasma state is normal, a separate process of measuring the wafer 2000 may not be needed.

In the method of monitoring the plasma state, according to the present example embodiment, the plasma light of the specific region in the chamber 1110 may be detected by detecting the plasma light through the viewport 1120 of the chamber 1110 by using the OES apparatus 500 (500*a*) including the tube-type lens 100. In addition, the plasma state of the specific region may be very precisely detected and monitored by measuring the plasma light while changing the focal point of the first lens 120 and comparing the measured plasma light with the light intensity graph of the ideal plasma state. In addition, the method of controlling the plasma process, according to the present example embodiment, may appropriately control the process conditions of the plasma process based on the accurate monitoring of the plasma state in the chamber 1110 by using the OES apparatus 500 (500*a*) so as to optimize the plasma process.

Figure 22:
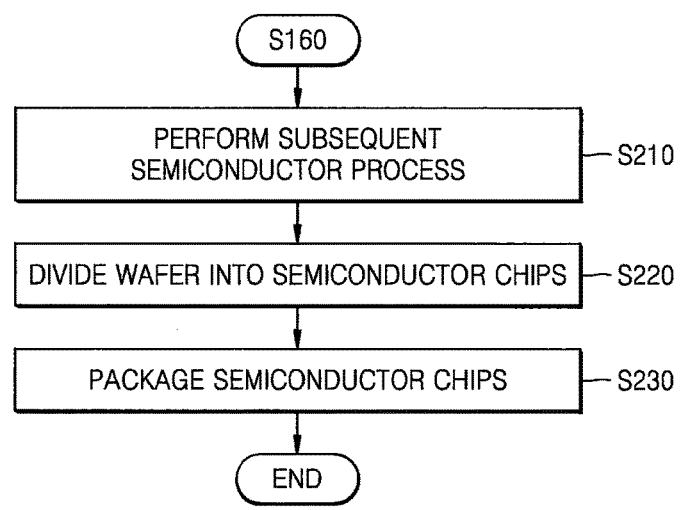
FIG. 22 is a flowchart of a method of manufacturing a semiconductor device through the control of a plasma process, according to an example embodiment of the inventive concept.

FIG. 22 is a flowchart of a method of manufacturing a semiconductor device through the control of the plasma process, according to an example embodiment of the inventive concept.

Referring to FIG. 22, the method of monitoring the plasma state and controlling the plasma process, which has been described with reference to FIG. 21, may be performed. The method of monitoring the plasma state and controlling the plasma process may include the plasma process for the wafer 2000. For example, operation S130 of generating the plasma, which has been described with reference to FIG. 21, may correspond to the plasma process for the wafer 2000.

For reference, "S160" in FIG. 22 may mean that the method of monitoring the plasma state and controlling the plasma process in FIG. 22 is performed. An arrow from operation "S160" may mean that the method of monitoring the plasma state and controlling the plasma process is ended and the process proceeds to next operation. More specifically, when it is determined in operation S160 that the plasma state is within the allowable range (Yes), the method of monitoring the plasma state and controlling the plasma process may be ended and the process may proceed to next operation.

In operation S210, a subsequent semiconductor process may be performed on the wafer 2000. The subsequent semiconductor process on the wafer 2000 may include various processes. For example, the subsequent semiconductor process on the wafer 2000 may include a deposition process, an etching process, an ion process, and a cleaning process. The deposition process, the etching process, the ion process, and the cleaning process may be processes using plasma or may be processes using no plasma. In the case of the processes using the plasma, the above-described method of monitoring the plasma state and controlling the plasma process may be applied again. Integrated circuits and lines required in the relevant semiconductor device may be formed by performing the subsequent semiconductor process on the wafer 2000. The subsequent semiconductor process on the wafer 2000 may include a process of testing the semiconductor device at a wafer level.

In operation S220, the wafer 2000 may be diced or divided into semiconductor chips. The dividing of the wafer 2000 into the semiconductor chips may be performed by a sawing process using a blade or a laser.

In operation S230, a process of packaging the semiconductor chips may be performed. The packaging process may mean a process of mounting the semiconductor chips on a printed circuit board (PCB) and sealing the semiconductor chips by a sealant. The packaging process may include a process of forming a stack package by stacking a plurality of semiconductors on a PCB in a multilayer structure or a process of forming a package on package (POP) by stacking a stack package on a stack package. The semiconductor device or the semiconductor package may be completed through the process of packaging the semiconductor chip. After the packaging process, a process of testing the semiconductor package may be performed.

The method of manufacturing the semiconductor device, according to the present example embodiment, may optimize the plasma process by performing the monitoring the plasma state and the control of the plasma process by using the plasma monitoring system 10000 or 10000a of FIG. 19 or 20. In addition, since the semiconductor devices are manufactured based on the optimized plasma process, it is possible to implement an excellent semiconductor devices having high reliability.

While the inventive concept has been particularly shown and described with reference to example embodiments thereof, it will be understood that various changes in form and details may be made therein without departing from the spirit and scope of the following claims.

What is claimed is:

1. A tube-type lens comprising:
   a cylindrical tube;
   a first lens configured to receive incident light into the cylindrical tube, the first lens being disposed at an entrance of the cylindrical tube, the first lens including a central portion configured to prevent transmission of light incident therethrough; and
   a second lens configured to permit light to exit from the tube, the second lens being disposed at an exit of the cylindrical tube.

2. The tube-type lens of claim 1, wherein the central portion of the first lens comprises a light blocking unit.

3. The tube-type lens of claim 2, wherein the light blocking unit comprises:
   an opaque material layer filling a groove or a through-hole formed in the central portion of the first lens, or
   an opaque tape attached to a surface of the central portion of the first lens.

4. The tube-type lens of claim 1, further comprising a light blocking structure disposed between the entrance of the cylindrical tube and the first lens and configured to prevent light entering the cylindrical tube from traveling toward the central portion of the first lens.

5. The tube-type lens of claim 4, wherein the light blocking structure comprises an optical filter, wherein a central portion of the optical filter corresponding to the central portion of the first lens is configured to prevent transmission of light incident on the optical filter or has a low transmittance value.

6. The tube-type lens of claim 1, wherein the first lens is configured to be replaced with another lens having a different focal point from the first lens, and
   a focal point of the second lens is fixed.

7. An optical emission spectroscopy (OES) apparatus comprising:
   a tube-type lens comprising: a cylindrical tube; a first lens disposed at an entrance of the cylindrical tube, the first lens including a central portion that is configured to prevent transmission of light incident therethrough, and a second lens disposed at an exit of the cylindrical tube; and
   a spectroscope coupled to the tube-type lens at the entrance of the cylindrical tube.

8. The OES apparatus of claim 7, wherein
   the central portion of the first lens comprises a light blocking unit, or
   the tube-type lens comprises a light blocking structure disposed between the entrance of the cylindrical tube and the first lens.

9. The OES apparatus of claim 8, wherein
   the first lens comprises the light blocking unit, and
   the light blocking unit comprises: an opaque material layer filling the central portion of the first lens, or an opaque tape attached to a surface of the central portion of the first lens.

10. The OES apparatus of claim 7, wherein
    the spectroscope comprises an incidence aperture, on which light is incident, a diffraction grating configured to decompose the light according to wavelength, and an array detector configured to detect the decomposed light based on wavelength, and the tube-type lens is coupled to the spectroscope such that a focal point of the second lens is positioned in the incidence aperture.

11. The OES apparatus of claim 7, further comprising an optical fiber between the tube-type lens and the spectroscope,
wherein the tube-type lens is coupled to the optical fiber such that a focal point of the second lens is positioned on an incident surface of the optical fiber.

12. The OES apparatus of claim 7, wherein
the first lens is configured to be replaced with another lens having a different focal point from the first lens,
a focal point of the second lens is fixed, and
the tube-type lens is coupled to a viewport of a chamber in a non-invasive manner.

13. An optical emission spectroscopy (OES) apparatus comprising:
a tube-type lens comprising:
a cylindrical tube;
a first lens configured to receive incident light into the cylindrical tube, the first lens being disposed at an entrance of the cylindrical tube;
a second lens configured to permit light to exit from the tube, the second lens being disposed at an exit of the cylindrical tube; and
a light blocking portion configured to prevent transmission through a portion of the tube-type lens, wherein the light blocking portion comprises a light blocking unit, and a central portion of the first lens comprises a light blocking unit; and
a spectroscope coupled to the tube-type lens at the entrance of the cylindrical tube.

14. The OES apparatus of claim 13, wherein the light blocking portion comprises a light blocking structure disposed between the entrance of the cylindrical tube and the first lens.

15. The OES apparatus of claim 13, wherein
the first lens comprises the light blocking unit, and
the light blocking unit comprises: an opaque material layer filling the central portion of the first lens, or an opaque tape attached to a surface of the central portion of the first lens.

16. The OES apparatus of claim 13, wherein
the spectroscope comprises an incidence aperture, on which light is incident, a diffraction grating configured to decompose the light according to wavelength, and an array detector configured to detect the decomposed light based on wavelength, and
the tube-type lens is coupled to the spectroscope such that a focal point of the second lens is positioned in the incidence aperture.

17. The OES apparatus of claim 13, further comprising an optical fiber between the tube-type lens and the spectroscope,
wherein the tube-type lens is coupled to the optical fiber such that a focal point of the second lens is positioned on an incident surface of the optical fiber.

18. The OES apparatus of claim 17, further comprising a coupling guide configured to couple the tube-type lens to the optical fiber.

19. The OES apparatus of claim 13, wherein
the first lens is configured to be replaced with another lens having a different focal point from the first lens,
a focal point of the second lens is fixed, and
the tube-type lens is coupled to a viewport of a chamber in a non-invasive manner, and an entrance surface of the tube-type lens is coupled to an outer surface of the viewport at an angle within a predetermined range.

* * * * *